(12) United States Patent
Yamada

(10) Patent No.: US 7,449,351 B2
(45) Date of Patent: Nov. 11, 2008

(54) DISPLAY DEVICE, METHOD OF MANUFACTURING THE SAME, AND ELECTRONIC APPARATUS

(75) Inventor: Tadashi Yamada, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 335 days.

(21) Appl. No.: 11/092,843

(22) Filed: Mar. 30, 2005

(65) Prior Publication Data

US 2006/0017371 A1 Jan. 26, 2006

(30) Foreign Application Priority Data

Jul. 23, 2004 (JP) .............................. 2004-215329

(51) Int. Cl.
*H01L 29/43* (2006.01)
(52) U.S. Cl. ................... 438/29; 438/35; 257/E33.061
(58) Field of Classification Search ................... 438/29, 438/35; 257/E33.061
See application file for complete search history.

(56) References Cited

U.S. PATENT DOCUMENTS

| 6,635,508 | B2 * | 10/2003 | Arai et al. ....................... 438/99 |
| 6,720,198 | B2 * | 4/2004 | Yamagata et al. ............. 438/29 |
| 6,784,459 | B2 | 8/2004 | Seki et al. |
| 6,822,629 | B2 | 11/2004 | Yamazaki et al. |
| 6,841,803 | B2 * | 1/2005 | Aizawa et al. ................. 257/98 |
| 7,012,367 | B2 | 3/2006 | Seki |
| 7,037,157 | B2 * | 5/2006 | Murakami et al. ............ 445/24 |
| 2002/0122049 | A1 | 9/2002 | Freidhoff |
| 2003/0127656 | A1 * | 7/2003 | Aizawa et al. ................. 257/79 |
| 2004/0075093 | A1 * | 4/2004 | Arai et al. ....................... 257/66 |
| 2004/0119066 | A1 * | 6/2004 | Han et al. ....................... 257/40 |
| 2004/0242111 | A1 * | 12/2004 | Morii ............................ 445/24 |
| 2005/0003645 | A1 * | 1/2005 | Hirai ........................... 438/584 |
| 2005/0073829 | A1 * | 4/2005 | Burger et al. .................. 362/84 |
| 2005/0264182 | A1 | 12/2005 | Seki |

FOREIGN PATENT DOCUMENTS

| CN | 1381821 A | 11/2002 |
| CN | 1429051 A | 7/2003 |
| JP | A-11-142190 | 5/1999 |
| JP | A-2002-141170 | 5/2002 |
| JP | A 2002-252083 | 9/2002 |
| JP | A-2003-150082 | 5/2003 |
| JP | A-2004-184702 | 7/2004 |

\* cited by examiner

*Primary Examiner*—George Fourson
(74) *Attorney, Agent, or Firm*—Oliff & Berridge, PLC

(57) ABSTRACT

To provide a display device capable of improving display quality and of maintaining display quality for a long time. In a display device of the present invention having a display region composed of a plurality of pixels, the display region includes a first display region composed of a first group of pixels and displaying a first emission wavelength range and a second display region composed of a second group of pixel and displaying a second emission wavelength range different from the first emission wavelength range, and non-light-emitting pixels not having a light emitting function are formed in a boundary region between the first display region and the second display region.

2 Claims, 17 Drawing Sheets

DISPLAY DEVICE, METHOD OF MANUFACTURING THE SAME, AND ELECTRONIC APPARATUS

BACKGROUND

The present invention relates to a display device, a method of manufacturing the same, and an electronic apparatus.

Since self-emission display devices that are well known as organic EL devices do not require a backlight, they are in the limelight as devices having a small thickness. In the organic EL device, as disclosed in Patent Document 1, sub-pixels (minimal units of display) respectively having red (R), green (G), and blue (B) are arranged in a stripe shape in a display region, and full color display can be performed using three sub-pixels as one pixel.

[Patent Document 1] Japanese Unexamined Patent Application Publication No. 2002-252083

SUMMARY

The display device disclosed in Patent Document 1 has a structure in which pixels are arranged in the same pattern in the display region to uniformly perform full color display. Such a structure is suitable for a case in which display is performed such that the time integral value of brightness is substantially the same for every pixel in the display region as in a television. On the contrary, when display is performed such that the time integral value of brightness is different for every pixel in the display region, the following problems may arise. That is, 1) the brightness of the pixel having a color whose brightness time integral value is large is more rapidly deteriorated than pixels having other colors, 2) when the brightness of the pixel having a color whose brightness time integral value is large is relatively rapidly deteriorated, a white balance is destroyed as a whole, which causes the change of a color tone or the easy generation of burning, and 3) when three-color sub-pixels for color display are present in a region for monochromatic display, an aperture ratio is lowered, or brightness in the monochromatic display region deteriorates rapidly.

The present invention is designed to solve the above-mentioned problems, and it is an object of the present invention to provide a display device capable of improving display quality and of maintaining display quality for a long time. In addition, it is another object of the present invention to provide a method of effectively manufacturing the display device capable of displaying a high-quality image. Further, it is still another object of the present invention to provide an electronic apparatus equipped with the display device capable of displaying a high-quality image.

In order to achieve the above objects, the present invention provides a display device having a display region composed of a plurality of pixels, wherein the display region includes a first display region composed of a first group of pixels and displaying a first emission wavelength range and a second display region composed of a second group of pixels and displaying a second emission wavelength range different from the first emission wavelength range, and non-light-emitting pixels not having a light emitting function are formed in a boundary region between the first display region and the second display region. In addition, the first emission wavelength range and the second emission wavelength range do not have the same wavelength range. Therefore, it is preferable that both the ranges be completely different from each other, or one range may be included in the other range.

In the display device of the present invention having the above-mentioned structure, the first group of pixels in the first display region and the second group of pixels in the second display region have different emission wavelength ranges, that is, have different ranges (kinds) of colors that can be emitted. Therefore, the display region provided in the display device of the present invention is divided into at least a first display region and a second display region that can display different colors, so that it is possible to improve the degree of freedom on the design of the display region.

Further, in this case, pixels capable of emitting necessary color light components are provided in a predetermined region of the display region, and pixels having unnecessary colors can be removed from the region. Thus, it is possible to improve an aperture ratio as a whole. That is, in the conventional structure, for example, pixels for full-color display are provided in the region for monochromatic display, and pixels having unnecessary colors for monochromatic display are provided, which results in the lowering of an aperture ratio. However, in the present invention, it is possible to settle the above-mentioned problem by removing pixels having unnecessary colors.

Furthermore, it is possible to obtain the same degree of surface brightness as in the conventional structure in which pixels for full-color display are provided the entire display region, by constituting a predetermined display region only with pixels having necessary colors, although brightness per pixel is lowered. Therefore, the deterioration of brightness per pixel is decreased, and power consumption is also reduced. In addition, it is possible to maintain brightness for a long time.

Moreover, the display device of the present invention can improve resolution. That is, it is possible to greatly increase the number of pixels having necessary colors in a predetermined region, compared to the conventional structure in which the pixels for full-color display are provided in the entire display region, which makes it possible to improve resolution.

Further, in the display device of the present invention, since non-light-emitting pixels not having a light emitting function are provided in a boundary region between the first display region and the second display region, a defect in display is hardly generated in the boundary region. That is, it is difficult to form pixels in the boundary region as designed due to a problem of precision in manufacture. However, it is possible to improve contrast in the boundary region by forming the non-light-emitting pixels therein, without being influenced by the precision of manufacture.

Furthermore, the first pixels constituting the first display region and the second pixels constituting the second display region each are composed of a laminated structure of a plurality of functional layers. Therefore, it is possible to form the non-light-emitting pixels not having the functional layers in the boundary region between the first display region and the second display region. This structure makes it possible to reliably realize the non-light-emitting pixels.

The non-light-emitting pixels can also be formed in an outer circumferential portion of the display region in addition to the boundary region. That is, in some cases, it is difficult to form pixels in the outer circumferential portion other than the boundary region between the first display region and the second display region as designed. However, it is possible to overcome the difficulty by providing the non-light-emitting pixels in the outer circumferential portion. In addition, the outer circumferential portion includes pixels formed in the outermost portion of the display region and pixels more inward positioned than the outermost portion by several pixels (one to ten pixels, preferably 3 to 5 pixels).

Further, in the display device of the present invention, it is possible to improve display quality and the efficiency of manufacture by adopting the following structure.

First, the first pixel and the second pixel can have different laminated structures of the functional layers constituting the pixels. In the structure in which the display region is divided to correspond to each emission color as in the present invention, when the regions have different laminated structures of the functional layers constituting the pixels, the following effects can be obtained. That is, if emission colors are generally different from each other, the amounts of energy required for emitting the color light components are different. Therefore, each pixel must have a proper structure. However, when the pixels for full-color display are formed in the entire display region as in the conventional art, the pixels must be formed to have different structures corresponding to the patterns of the respective colors, which is a very laborious work. However, in the present invention, since the display region is divided, a different laminated structure of the functional layers is used for every display region, and a laminated structure suitable for each color can be easily realized. In addition, it is possible to adopt a laminated structure suitable for the emission color of each pixel by forming a different functional layer in each region, and it is also possible to improve the efficiency of emission and to maintain brightness for a long time.

Second, the first group of pixels can be composed of pixels capable of displaying a plurality of color light components, and the second group of pixels can be composed of pixels capable of displaying one kind of color light component. In this case, the first display region can display two or more colors, and the second display region can display a single color. Particularly, it is possible to improve an aperture ratio, resolution, and brightness lifetime in the second display region, compared to the conventional structure in which the pixels for full-color display are formed in the entire display region. More specifically, the first group of pixels can be composed of pixels each including at least a sub-pixel capable of emitting a predetermined color light component and sub-pixels capable of emitting color light components other than the predetermined color light component, and the second group of pixels can be composed of pixels each including only one kind of sub-pixel capable of a predetermined color light component. In this way, it is possible to realize the above-mentioned structure.

Third, the first group of pixels can be composed of pixels capable of performing full-color display, and the second group of pixels can be composed of pixels capable of performing monochromatic display. More specifically, the first group of pixels can be composed of pixels each including a sub-pixel capable of emitting a red light component, a sub-pixel capable of emitting a green light component, and a sub-pixel capable of emitting a blue light component, and the second group of pixels can be composed of pixels each including one or two sub-pixels selected from the sub-pixel capable of emitting the red light component, the sub-pixel capable of emitting the green light component, and the sub-pixel capable of emitting the blue light component. In addition, when plural kinds of sub-pixels are included as described above, the plural kinds of sub-pixels can be constructed to have the same size. In this case, it is possible to adjust an aperture ratio according to the number of sub-pixels formed in the display region, and thus it is easy to design the aperture ratio. Further, it is preferable that the sub-pixel be formed in a rectangular shape and that the pixel be formed in a square shape including a plurality of the rectangular sub-pixels.

Fourth, a laminated layer of a cathode, an anode, and an organic EL layer formed between the cathode and the anode can be used as the functional layer included in the display device of the present invention. The first group of pixels is composed of the first pixels each including a sub-pixel capable of emitting the blue light component, and the second group of pixels is composed of the second pixels each including a sub-pixel capable of emitting the red light component and not including a sub-pixel capable of the blue light component. In addition, the display device can be constructed such that the cathode constituting the functional layer of the first pixel includes lithium fluoride, and the cathode constituting the functional layer of the second pixel does not include the lithium fluoride. In the organic EL layer serving as the light emitting functional layer, emission efficiency is different for each emission color. Particularly, the emission efficiency of the organic EL layer emitting a red light component is largely different from that of the organic EL layer emitting a blue light component due to the difference of a cathode structure. Thus, it is preferable that the cathode be constructed suitable to each organic EL layer. More specifically, it is possible to improve the emission efficiency of the blue organic EL layer by making lithium fluoride included in the cathode. However, in this case, the emission efficiency of the red organic EL layer is remarkably lowered. Therefore, when the display region is divided as in the present invention, it is easy to use different cathode structures for the divided display regions. More specifically, in the display region composed of the first pixels each including a blue sub-pixel and the display region composed of the second pixels each including a red sub-pixel and not including the blue sub-pixel, the respective pixels can be formed so as to have different cathode structures, and thus it is possible to easily improve emission efficiency.

Furthermore, when the organic EL layer is provided as the functional layer, the display device can be constructed such that the first group of pixels is composed of the first pixels each including a sub-pixel capable of emitting a red light component, a sub-pixel capable of emitting a green light component, and a sub-pixel capable of emitting a blue light component, and the second group of pixels is composed of the second pixels each including only the sub-pixel capable of emitting the red light component. In addition, the display device can be constructed such that the cathode constituting the functional layer of the first pixel includes lithium fluoride and the cathode constituting the functional layer of the second pixel does not include the lithium fluoride. In this case, similar to the above, it is possible to make the cathode structures of the respective pixels different from each other, and it is possible to easily improve emission efficiency. In addition, as for the detailed cathode structure, the cathode constituting the functional layer of the first pixel can have a combined structure of lithium fluoride, calcium, and aluminum, and the cathode constituting the functional layer of the second pixel can have a combined structure of calcium and aluminum.

Next, in order to solve the above-mentioned problems, the present invention provides a method of manufacturing a display device having a display region composed of a plurality of pixels, the display region including a first display region composed of a first group of pixels displaying a first emission wavelength range and a second display region composed of a second group of pixels displaying a second emission wavelength range different from the first emission wavelength range, the method comprising: a step of forming a bank portion having apertures respectively corresponding to the pixels on a substrate; and a step of forming a functional layer for allowing the pixels to emit light in the apertures constructed by the bank portion, wherein the step of forming the functional layer includes: a step of dispersing and dissolving a functional material for forming the functional layer in a solvent to prepare a liquid composition; a step of selectively discharging the prepared liquid composition into the apertures using a liquid discharging method; and a step of drying the discharged liquid composition, and wherein, in the discharging step, the liquid composition is selectively not discharged into the apertures positioned in a boundary region between the first display region and the second display region.

As such, since the liquid composition is not selectively discharged in the boundary region between the first display region and the second display region, it is possible to properly form the non-light-emitting pixels in the display device of the present invention. That is, different liquid compositions are respectively discharged in the first display region and the second display region. Therefore, when a liquid discharging method is used, it is easy that liquid droplets are unstably discharged into the boundary region, so that the functional layer is formed with a non-uniform thickness due to the unstable discharging, which results in a reduction in the contrast of the display device to be manufactured. Therefore, the liquid composition is not discharged into the apertures in the boundary region to form the non-light-emitting pixels, which makes it possible to prevent or suppress the reduction of the contrast of a display device.

In the discharging step, the liquid composition is discharged into the apertures by scanning a liquid discharging head in a predetermined direction, and in the scanning, the liquid composition is selectively not discharged into the apertures positioned in the boundary region. When the liquid composition is discharged by the liquid discharging head, the kind of the liquid composition to be discharged must be changed in the boundary region in the course of the scanning of the head. However, at the time of the change of the liquid composition, the above-mentioned unstable discharging can occur. Therefore, when the liquid composition is not discharged into the apertures positioned in the boundary region, it is possible to prevent or suppress the reduction of contrast in the display device manufactured as described above.

Further, in the discharging step, the liquid composition is selectively not discharged into the apertures positioned in an outer circumferential region of the display region, in addition to the boundary region. That is, in some cases, it is difficult to form pixels in the outer circumferential portion as well as the boundary region between the first display region and the second display region as designed. Therefore, it is preferable not to discharge the liquid composition onto the pixels in the outer circumferential portion to form the non-light-emitting pixels therein. In addition, the outer circumferential portion includes pixels formed in the outermost portion of the display region and pixels more inward positioned than the outermost portion by several pixels (one to ten pixels, preferably 3 to 5 pixels).

Next, an electronic apparatus of the present invention has the above-mentioned display device, and in such an electronic apparatus, the display unit thereof can display a high-quality image and maintain display quality for a long time.

DETAILED DESCRIPTION OF EMBODIMENTS

Figure 1:
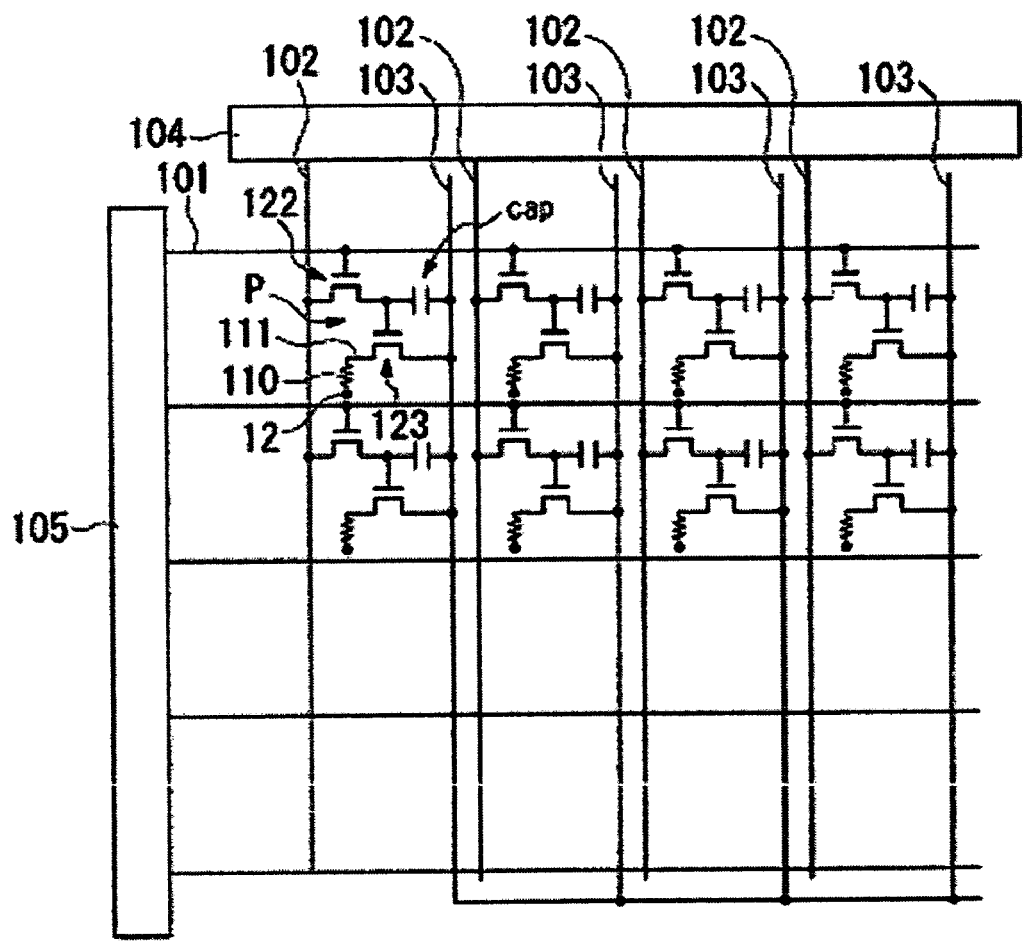
FIG. 1 is a circuit diagram of an organic EL device according to an embodiment of the present invention.

Hereinafter, an organic electroluminescent (EL) device and a method of manufacturing the organic EL device according to a first embodiment of the present invention will be described with reference to the accompanying drawings. Further, in order to make each layer and each member recognizable in the drawings, each layer and each member have different reduced scales.

(Organic EL Device)

Figure 2:
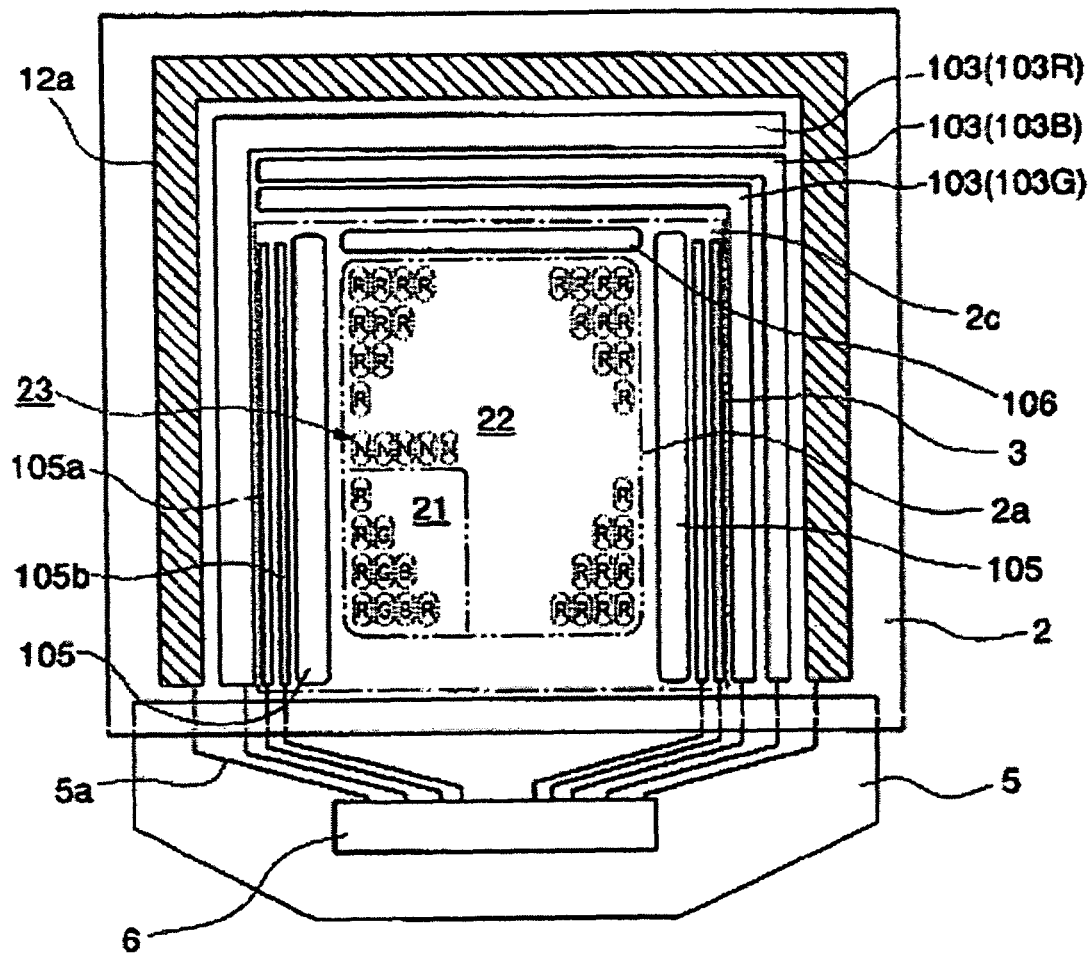
FIG. 2 is a plan view illustrating the structure of the organic EL device.
Figure 3:
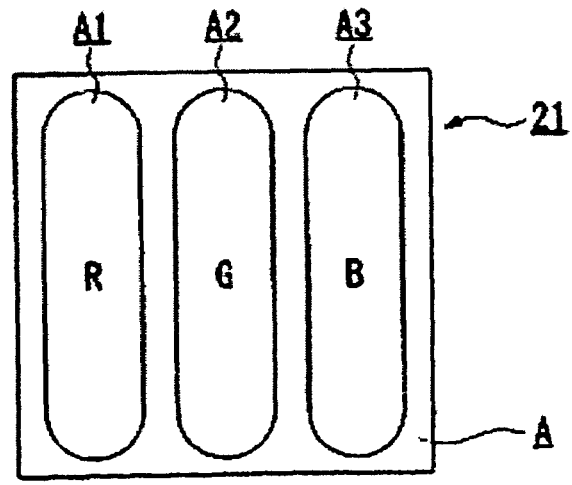
FIG. 3 is a plan view illustrating the structure of a pixel in a first display region.
Figure 4:
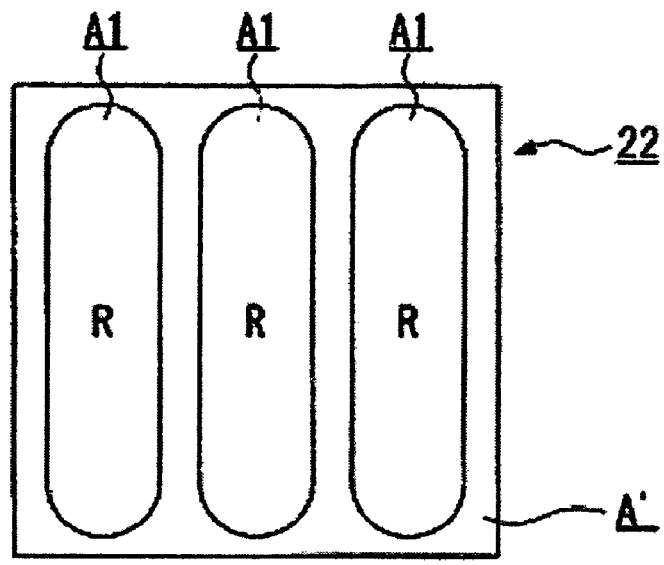
FIG. 4 is a plan view illustrating the structure of a pixel in a second display region.
Figure 5:
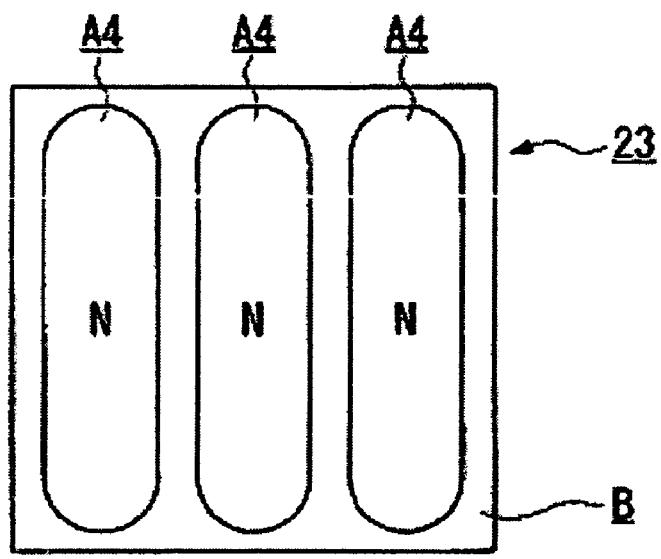
FIG. 5 is a plan view illustrating the structure of a pixel in a dummy display region.
Figure 6:
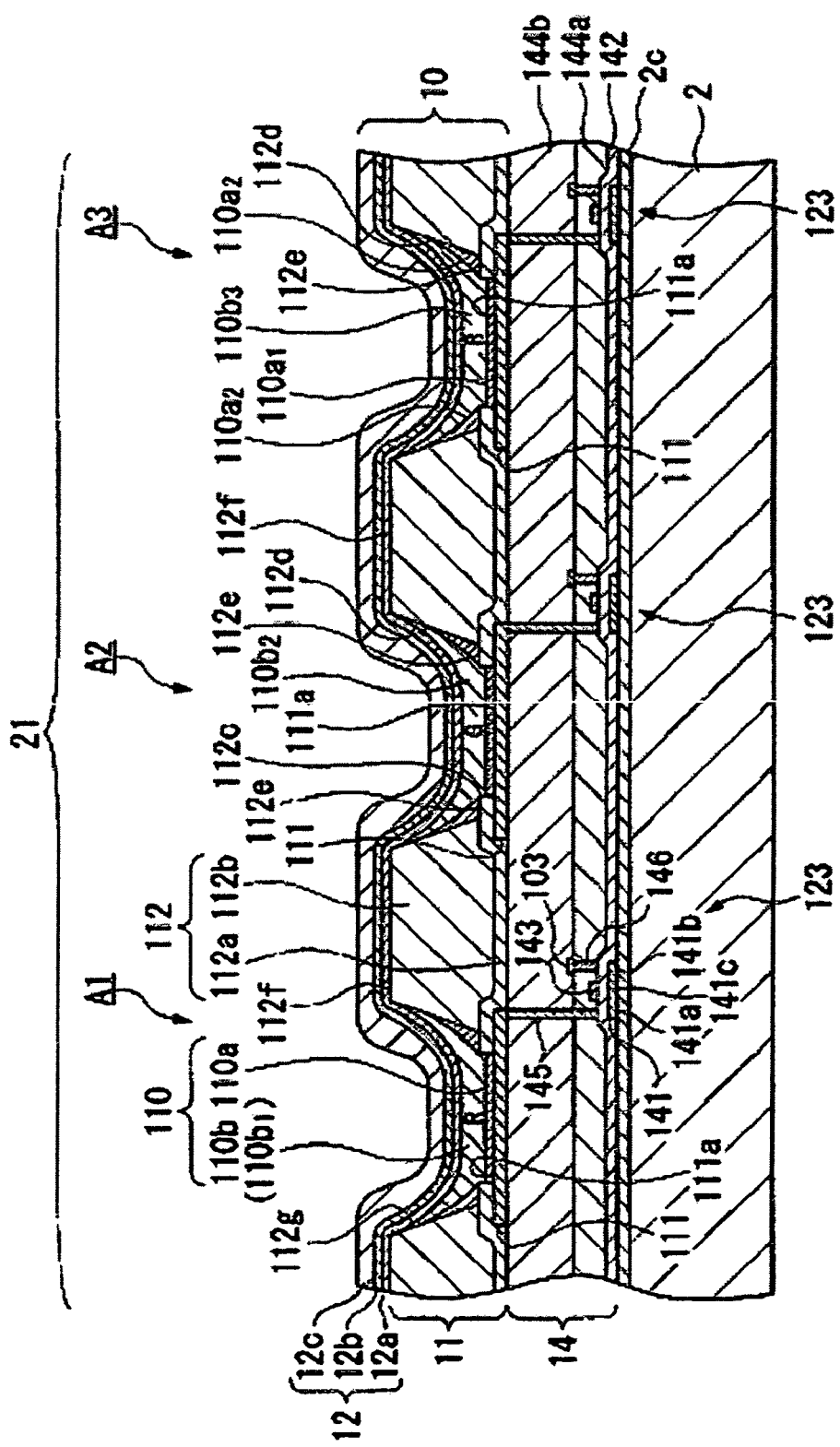
FIG. 6 is a view illustrating the sectional structure of the first display region.
Figure 7:
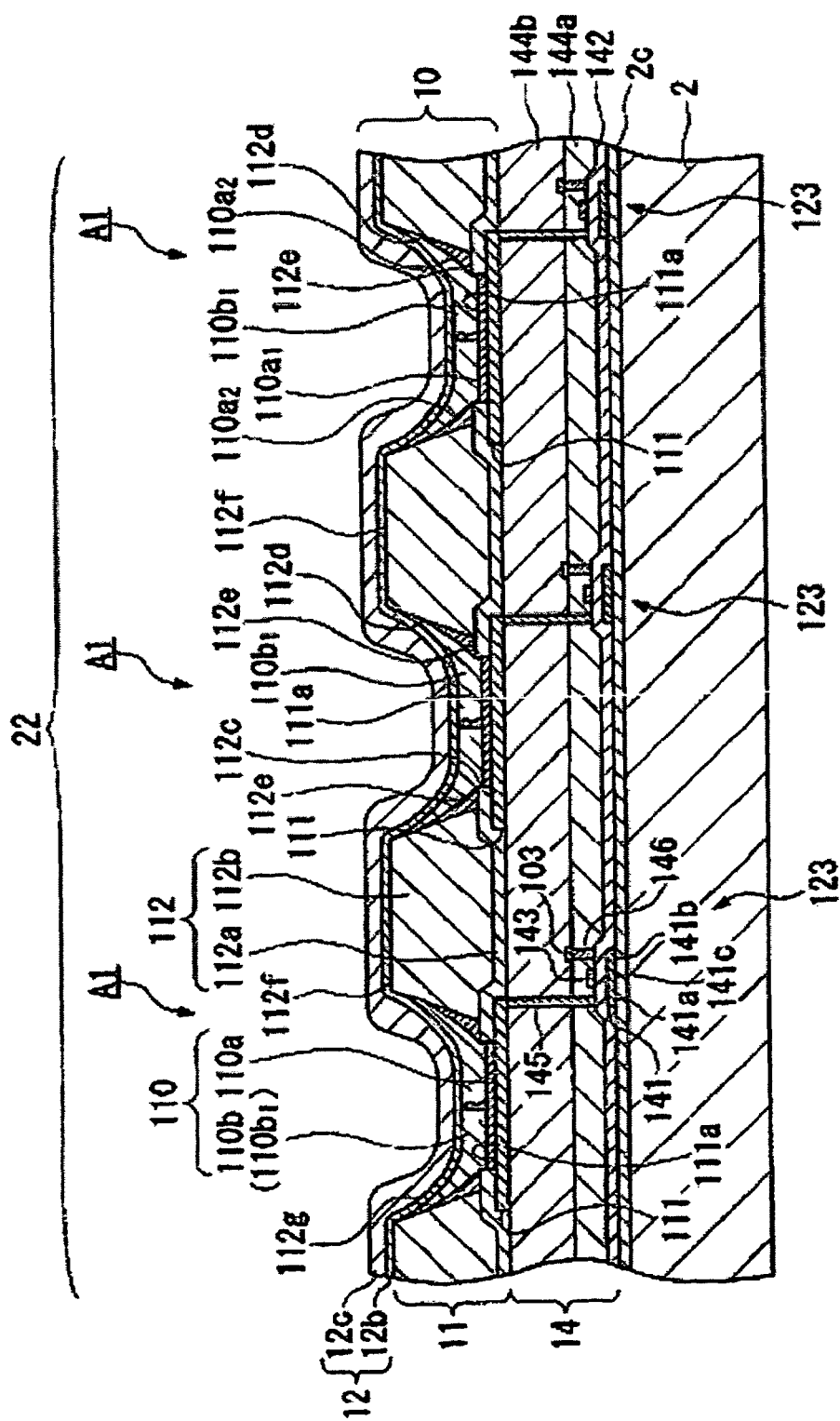
FIG. 7 is a view illustrating the sectional structure of the second display region.
Figure 8:
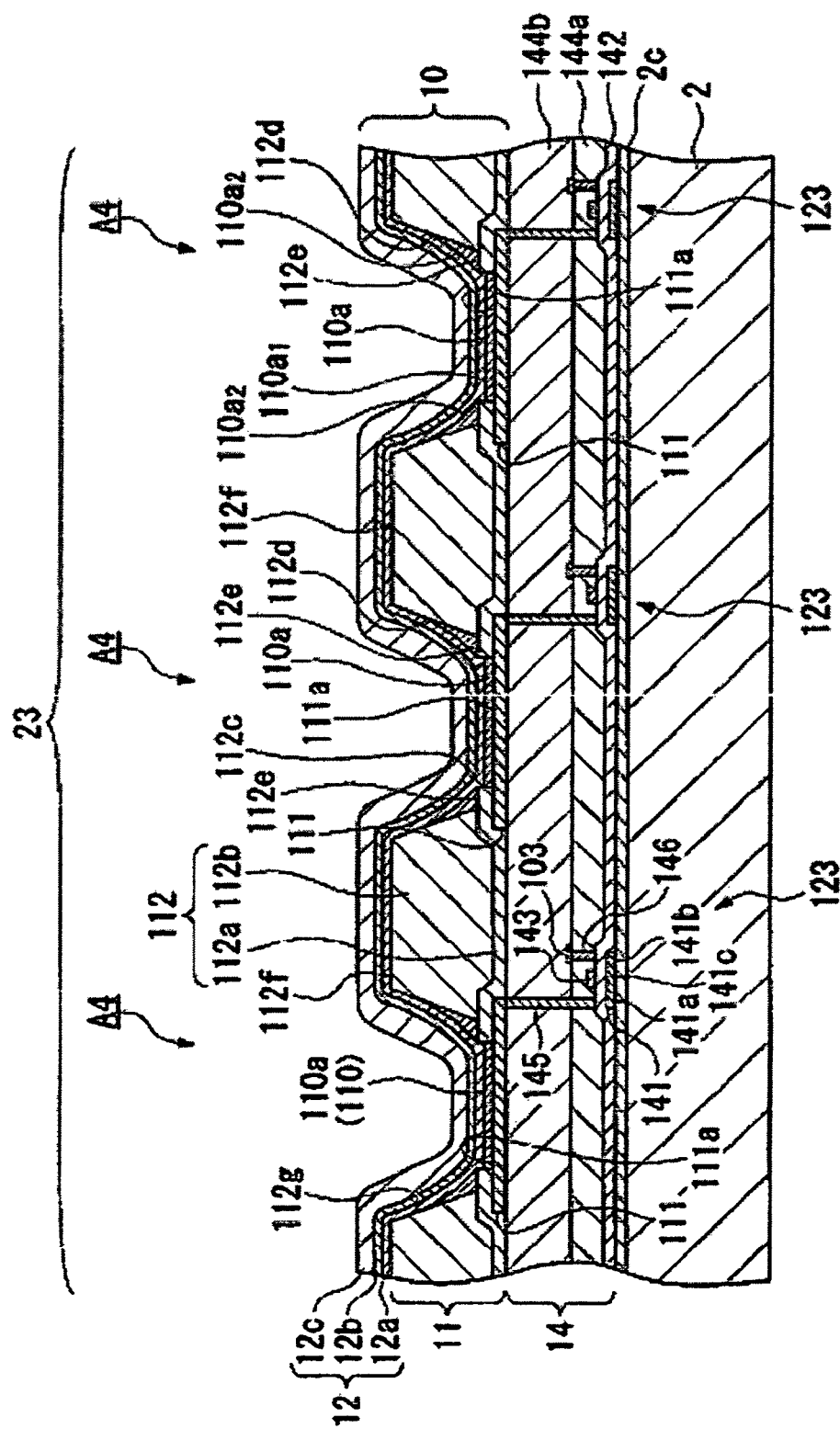
FIG. 8 is a view illustrating the sectional structure of the dummy display region.

FIG. 1 is a view illustrating the configuration of wiring lines of an organic EL device according to the present embodiment, and FIG. 2 is a schematic plan view of the organic EL device according to the present embodiment. In addition, FIGS. 3, 4, and 5 are enlarged plan views illustrating the configuration of a pixel, and FIGS. 6, 7, and 8 are cross-sectional views schematically illustrating a display region of the organic EL device according to the present embodiment.

As shown in FIG. 1, the organic EL device of the present embodiment includes a plurality of scanning lines 101, a plurality of signal lines 102 extending orthogonal to the scanning lines 101, and a plurality of power lines 103 extending parallel to the signal lines 102. In addition, unit display regions P are provided in the vicinity of intersections of the scanning lines 101 and the signal lines 102.

The signal lines 102 are connected to a signal line driving circuit 104 comprising shift registers, level shifters, video lines, and analog switches. In addition the scanning lines 101 are connected to a scanning line driving circuit 105 comprising shift registers and level shifters.

Further, each unit display region P is provided with a switching thin film transistor 122 having a gate electrode to which a scanning signal is supplied through the scanning line 101, a storage capacitor cap for holding an image signal supplied from the signal line 102 through the switching thin film transistor 122, a driving thin film transistor 123 having a gate electrode to which the image signal held in the storage capacitor cap is supplied, a pixel electrode (electrode) 111 to which a driving current is supplied from the power line 103 when the pixel electrode 111 is electrically connected to the power line 103 through the driving thin film transistor 123, and an organic EL layer 110 interposed between the pixel electrode 111 and a cathode (counter electrode) 12. The electrode 111, the counter electrode 12, and the organic EL layer 110 constitute a light emitting element.

When the scanning line 101 is driven to turn on the switching thin film transistor 122, the electric potential of the signal line 102 at that time is stored in the storage capacitor cap. Then, an on or off state of the driving thin film transistor 123 is determined in accordance with the state of the storage capacitor cap. A current flows from the power line 103 to the pixel electrode 111 through a channel of the driving thin film transistor 123, and the current flows to a cathode 12 through the organic EL layer 110. The organic EL layer 110 emits light corresponding to the amount of current flowing therethrough.

As shown in FIGS. 6 and 8, the organic EL device of the present embodiment includes a transparent substrate 1 made of, for example, glass, a light emitting element portion 11 formed on a substrate 2 and having light emitting elements arranged in a matrix, the cathode 12 formed on the light emitting element portion 11. Here, the light emitting element portion 11 and the cathode 12 constitute a display element 10.

As shown in FIG. 2, the substrate 2 is made of a transparent material, such as glass, and has a display region 2a positioned at the center thereof and a non-display region 2c positioned in the periphery thereof to surround the display region 2a.

The display region 2a is a region formed by the light emitting elements arranged in a matrix and has a plurality of dots (sub-pixels), each being a minimum driving unit of display, capable of emitting R (red), G (green), and B (blue) colored light components, respectively. Each dot constitutes the unit display region P shown in FIG. 1. In the present embodiment, the display region 2a is composed of a first display region 21 for performing color display, a second display region 22 for performing monochromatic display, and a dummy display region 23, which is a boundary region between the first display region 21 and the second display region where display is not performed.

As shown in FIG. 3, a plurality of pixels A each having three different color dots, that is, an R dot A1, a G dot A2, and a B dot A3 capable of emitting R, G, and B light components, respectively, are arranged in the first display region 21. In addition, as shown in FIG. 4, a plurality of pixels A' each having three R dots A1 capable of emitting the R light component are arranged in the second display region 22. As shown in FIG. 5, a plurality of pixels (non-light-emitting pixels) B each including three N dots (non-light-emitting dots) having a light emitting function are arranged in the dummy display region 23.

That is, the pixels A and A' are placed in a predetermined arrangement in the display region 2a, and the pixel A is different from the pixel A' in a light emitting wavelength range. In other words, the pixel A can emit light in the full-color wavelength range (a wavelength of about 380 nm to 780 nm), and the pixel A' can emit light in the red wavelength range (a wavelength of about 580 nm to 780 nm). Therefore, a display region having a first group of pixels including the plurality of pixels A aligned in a predetermined arrangement is composed of the first display region 21 capable of performing full color display, and a display region having a second group of pixels including the plurality of pixels A' aligned in a predetermined arrangement is composed of the second display region 22 capable of performing red display. In addition, as shown in FIGS. 3 and 4, the respective dots (sub-pixels) A1, A2, and A3 have the same wavelength and area, and the respective pixels A and A' are formed substantially in a square shape.

Referring to FIG. 2 again, the power lines 103 (103R, 103G, and 103B) are provided in the non-display region 2c. The scanning line driving circuits 105 are arranged at both sides of the display region 2a, respectively. In addition, a control signal wiring line 105a for a driving circuit and a power wiring line 105b for a driving circuit are provided at one side of each scanning line driving circuit 105. Further, a test circuit 106 is provided at the upper side of the display region 2a in plan view for testing the quality and detects of a display device during manufacture or at the time of shipment.

FIG. 6 is a view illustrating the sectional structure of the first display region 21, and the first display region 21 is composed of three types of dots (sub-dots) A1, A2, and A3 as described above.

A circuit element portion 14 having circuits, such as TFTs, therein, the light emitting element portion 11 having the organic EL layer 110 therein, and the cathode 12 are sequentially laminated on the substrate 2 to form the first display region 21. Light emitted from the organic EL layer 110 toward the substrate 2 is emitted from the lower side (observer side) of the substrate 2 through the circuit element portion 14 and the substrate 2, and light reflected from the organic EL layer 110 toward the substrate 2 is reflected from the cathode 12 and is then emitted from the lower side (observer side) of the substrate through the circuit element portion 14 and the substrate 2.

In the circuit element portion 14, a base protective film 2c composed of a silicon oxide film is formed on the substrate 2, and an island-shaped semiconductor film 141 made of polycrystalline silicon is formed on the base protective film 2c. A source region 141a and a drain region 141b are formed in the semiconductor film 141 by heavily doping phosphorous ions therein. The other region in which the ions are not doped is a channel region 141c.

Further, a transparent gate insulting film 142 is formed so as to cover the base protective film 2c and the semiconductor film 141, and a gate electrode 143 (the scanning line 101) made of Al, Mo, Ta, Ti, or W is formed on the gate insulating film 142. In addition, first and second interlayer insulating films 144a and 144b made of a transparent material are formed on the gate electrode 143 and the gate insulating film 142. The gate electrode 143 is provided at a position corresponding to the channel region 141c of the semiconductor film 141. Further, contact holes 145 and 146 are formed such that they pass through the first and second interlayer insulating films 144a and 144b to be respectively connected to the source and the drain regions 141a and 141b of the semiconductor film 141.

Furthermore, pixel electrodes 111 made of a transparent material, such as an ITO, are formed in a predetermined shape on the second interlayer insulating film 144b by patterning, and the contact hole 145 is connected to the pixel electrode 111. In addition, the other contact hole 146 is connected to the power line 103. In this way, the driving thin film transistors 123 connected to the respective pixel electrodes 111 are formed in the circuit element portion 14.

The light emitting element portion 11 mainly comprises the organic EL layer 110 formed on the plurality of pixel electrodes 111 and a bank portion 112 provided between the respective pixel electrodes 111 and the organic EL layer 110 to partition the organic EL layer 110. The cathode 12 is arranged on the organic EL layer 110. The pixel electrodes 111, and the organic EL layer 110, and the cathode 12 constitute a light emitting element. Here, the pixel electrode 111 is made of, for example, ITO and is patterned substantially in a square shape in plan view. In addition, the bank portion 112 is provided to partition the respective pixel electrodes 111.

As shown in FIG. 6, the bank portion 112 is formed in a laminated structure of an inorganic bank layer (a first bank layer) 112a positioned on the side of the substrate 2, serving as a first partition portion, and an organic bank layer (a second bank layer) 112b separated from the substrate 2, serving as a second partition portion. The inorganic bank layer 112a is made of, for example, TiO$_2$ or SiO, and the organic bank layer 112b is made of, for example, acrylic resin or polyimide resin.

The inorganic and organic bank layers 112a and 112b are formed so as to be laid across the edge of the pixel electrode. That is, the inorganic bank layer 112a is arranged so as to overlap a portion of the pixel electrode 111 in plan view. In addition, similarly, the organic bank layer 112b is arranged so as to overlap a portion of the pixel electrode 111 in plan view. Further, the inorganic bank layer 111a is formed so as to protrude from the edge of the organic bank layer 112b toward the center of the pixel electrode 111. In this way, first laminated portions (protruding portions) 112e of the inorganic bank layer 112a are formed at the inside of the pixel electrode 111, so that a lower aperture 112c is provided corresponding to the position where the pixel electrode 111 is formed.

Furthermore, an upper aperture 112d is provided in the organic bank layer 112b. The upper aperture 112d is provided corresponding to the lower aperture 112c and the position where the pixel electrode 111 is formed. As shown in FIG. 6, the upper aperture 112d is formed larger than the lower aperture 112c and smaller than the pixel electrode 111 in size. In addition, the upper aperture 112d may be formed such that the upside position thereof is substantially equal to the position of the edge of the pixel electrode 111. In this case, as shown in FIG. 6, the upper aperture 112d of the organic bank layer 112 has an oblique section. In this way, an aperture 112g composed of the lower aperture 112c and the upper aperture 112d communicating with each other is formed in the bank portion 112.

Moreover, regions having a lyophilic property and regions having a lyophobic property are formed in the bank portion 112. The first laminated portion 112e of the inorganic bank layer 112a and an electrode surface 111a of the pixel electrode 111 belong to the regions having a lyophilic property, and the surfaces of the regions are subjected to a plasma process in which oxygen is used as raw gas to have the lyophilic property. In addition, the wall of the upper aperture 112d and an upper surface 112f of the organic bank layer 112 belong to the regions having a lyophobic property, and the surfaces of these regions are subjected to a plasma process in which methane tetrafluoride, tetrafluomethane, or tetrafluorocarbon is used as raw gas to be fluorinated (to have a lyophobic property).

Meanwhile, the organic EL layer 110 is composed of a hole injection/transporting layer 110a formed on the pixel electrode 111 and a light emitting layer 110b formed on the hole injecting/transporting layer 110a.

The hole injecting/transporting layer 110a has a function of injecting holes into the light emitting layer 110b and a function of transporting the holes inside the hole injecting/transporting layer 110a. By providing the hole injecting/transporting layer 110a between the pixel electrode 111 and the light emitting layer 110b, it is possible to improve the emission efficiency of the light emitting layer 110b and to lengthen the life span thereof. In addition, in the light emitting layer 110b, the holes injected from the bole injecting/transporting layer 110a and electrons injected from the cathode 12 are recombined, resulting in the emission of light.

The hole injecting/transporting layer 110a includes a flat portion 110a1 formed on the pixel electrode surface 111a in the lower aperture 112c and a circumferential portion 110a2 formed on the first laminated layer 112e of the inorganic bank layer in the upper aperture 112d. In addition, the hole injecting/transporting layer 110a is formed only between the inorganic bank layers 112a (in the lower aperture 112c) on the pixel electrode 111 from the viewpoint of structure (the hole injecting/transporting layer 110a may be formed on only the above-mentioned flat portion).

Further, the light emitting layer 110b is formed to be put across the flat portion 110a1 and the circumferential portion 110a2 of the hole injecting/transporting layer 110a.

The thickness of the light emitting layer 110b on the flat portion 110a1 is in the range of 50 nm to 80 nm. The light emitting layer 110b has three types of light emitting layers, that is, a red light emitting layer 110b emitting a red (R) light component, a green light emitting layer 110b2 emitting a green (G) light component, and a blue light emitting layer 110b3 emitting a blue light component, and the respective light emitting layers 110b1 to 110b3 are arranged in a stripe shape in plan view.

Furthermore, as a material for forming the hole injecting/transporting layer, a compound of a polythiophene derivative, such as polyethylenedioxethiophene, and polystyrenesulfonic acid can be used. In addition, the light emitting layer 110b can be made of the following material: (poly) paraphenylenevinylene derivative, polyphenylene derivative, polyfluorene derivative, polyvinylcarbazole, polythiophene derivative, perylene-based pigment, coumarin-based pigment, rhodamine-based pigment, or compounds obtained by respectively doping, into these high-molecular materials, rubrene, perylene, 9,10-diphenylanthracene, tetraphenylbutadiene, nile red, coumarin 6, and quinacridon.

The cathode 12 is formed on the entire surface of the light emitting element portion 11 and is provided opposite to the pixel electrodes 111 to make a current flow through the organic EL layer 110. The cathode 12 is formed by laminating a lithium fluoride layer 12a, a calcium layer 12b, and an aluminum layer 12c in the first display region 21. At that time, it is preferable that one of these layers having a low work function be provided close to the light emitting layer 110b. Particularly, in the present embodiment, the layer is provided so as to directly come into contact with the light emitting layer 110b to inject electrons into the light emitting layer 110b.

The aluminum layer 12c constituting the cathode 12 reflects the light emitted from the light emitting layer 110b toward the substrate 2 and is preferably made of silver other than aluminum or a laminated film of aluminum and silver. In addition, a protective film for preventing oxidation, made of SiO, $SiO_2$, and SiN, may be formed on the aluminum layer 12c. Further, in the first display region 21, the thickness of the lithium layer 12a, the calcium layer 12b, and the aluminum layer 12c, which constitute the cathode 12, is about 5 nm, 5 nm, and 200 nm, respectively.

In the actual organic EL device, a sealing member is provided on the light emitting element portion 11 shown in FIG. 6. The sealing member can be formed, for example, by applying a sealing resin on the circumferential portion of the substrate 2 in a ring shape and by sealing it using a sealing can. The sealing resin is composed of a thermosetting resin or an ultraviolet ray curable resin. Particularly, the sealing resin is preferably composed of an epoxy resin, which is a kind of thermosetting resin. This sealing member is provided to prevent the oxidation of the light emitting layer formed in the light emitting element portion 11 or the cathode 12. In addition, a getter agent is provided inside the sealing can to absorb water and oxygen permeated thereinto from the outside.

Meanwhile, FIG. 7 is a view illustrating the sectional structure of the second display region 22 in which only the red dots (sub-pixels) A1 are formed. In addition, the second display region 22 is similar to the first display region 21 shown in FIG. 6 except the structures of the light emitting layer 110b and the cathode 12. Therefore, in FIG. 7, the description of the same structure as that in the first display region 21 will be omitted.

That is, in the second display region 22, three red dots A1 constitute one pixel, and each dot A1 is provided with the red light emitting layer 110b emitting the red (R) light component. In addition, in the first display region 21, the lithium fluoride layer 12a of the cathode 12 shown in FIG. 6 is formed on the light emitting layer 110b for improving the emission efficiency of light, but the lithium fluoride layer 12a is not provided in the second display region 22. This is because the lithium fluoride layer 12a is a functional layer for improving the emission efficiency of the blue light emitting layer 110b3 of the light emitting layer 110b emitting the blue (B) light component. In addition, for the thickness of the respective layers constituting the cathode 12 in the second display region 22, the calcium layer 12b has a thickness of about 2 nm, and the aluminum layer 12c has a thickness of about 200 nm.

Further, FIG. 8 is a view illustrating the sectional structure of the dummy display region 23 composed of only the non-light-emitting dots (sub-pixels) A4. In addition, the dummy display region 23 is similar to the first display region 21 in the sectional structure except the light emitting layer 110b. Thus, in FIG. 8, the description of the same structure as that of the first display region 21 will be omitted.

That is, in the dummy display region 23, three non-light-emitting dots A4 constitute one pixel (non-light-emitting pixel), and each dot A4 is not provided with the light emitting layer 110b unlike the first and second display regions 21 and 22. Here, the cathode 12 of the dummy display region 23 is composed of the lithium fluoride layer 12a, the calcium layer 12b, and the aluminum layer 12c, similar to the structure of the first display region 21, but the structure of the cathode 12 is not limited thereto. For example, the cathode 12 may be composed of the calcium layer 12b and the aluminum layer 12c as in the first display region 22, or may be composed of only the aluminum layer 12c.

Figure 9:
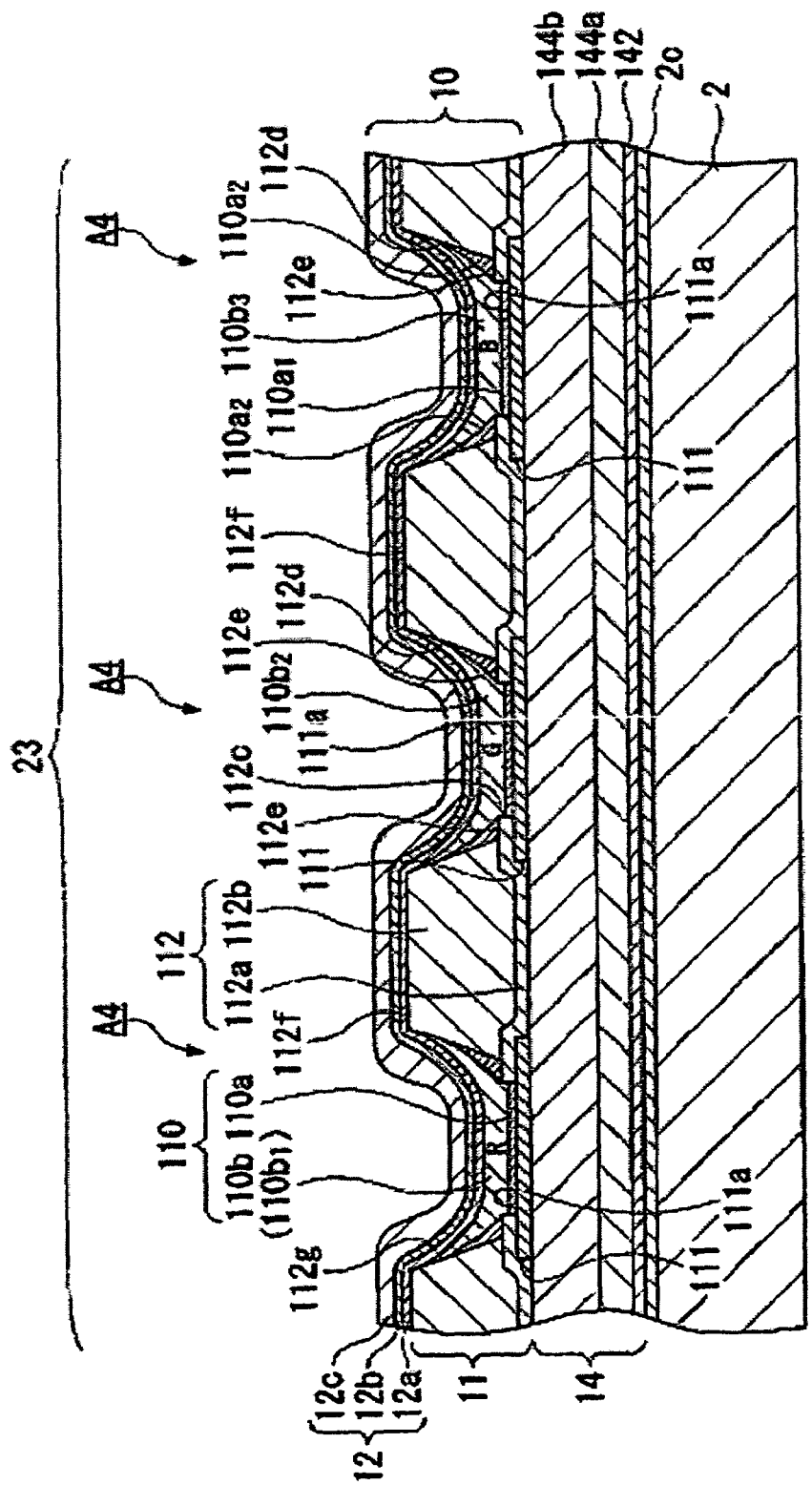
FIG. 9 is a view illustrating the sectional structure of a modification of the dummy display region.

Further, as shown in FIG. 9, the dummy display region 23 may have a structure in which the light emitting layer 110b is formed, but the driving thin film transistors 123 are not provided. In such a structure, since an emission driving voltage is not generated between the pixels, each dot (sub-dot) A4 functions as a non-light-emitting dot. In addition, another structure can be used in which both the thin film transistors 123 and the light emitting layer are formed and a current does not flow through a control circuit.

In the organic EL device according to the present embodiment having the above-mentioned structure, the display region 2a is composed of the first display region 21 capable of performing full-color display and the second display region 22 capable of performing only monochromatic display. In this case, pixels for full color display are not provided in the entire display region 2a, but pixels capable of emitting necessary color light are provided in a predetermined region (the second display region 22). In addition, pixels having unnecessary colors are excluded from the region 22, which makes it possible to improve an aperture ratio as a whole. Further, by constitute the predetermined region (the second display region 22) with the pixels having necessary colors, it is possible to obtain the same degree of surface brightness as the conventional structure in which the pixels for full color display are provided in the entire display region 2a although brightness per pixel becomes lower than that of the conventional structure. Accordingly, it is possible to reduce power consumption without greatly deteriorating brightness per pixel, and it is also possible to maintain brightness for a long time.

Figure 10:
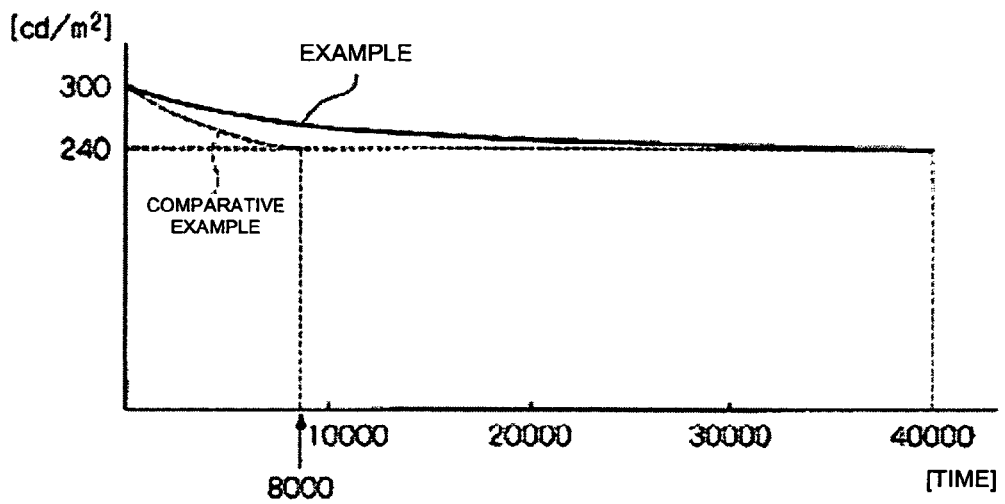
FIG. 10 is a graph illustrating the variation of brightness with the elapse of time in an example according to the present invention and the variation of brightness with the elapse of time in a comparative example.

More specifically, brightness is maintained for a long time as shown in FIG. 10. FIG. 10 is a graph illustrating the variation of brightness with the elapse of time in the second display region 22 (example) of the organic EL device according to the present embodiment and the variation of brightness in the conventional structure in which the pixels for full color display are provided in the entire display region (comparative example). In addition, in the graph shown in FIG. 10, the vertical axis indicates surface brightness per pixel ($cd/m^2$), and the horizontal axis indicates time (hour).

As shown in FIG. 10, according to the organic EL device of the present embodiment, when pixels are provided such that a surface brightness of 300 $cd/m^2$ is obtained from one pixel at the beginning in the organic EL devices of the example of the present invention and the comparative example, brightness becomes 80% of the initial value after 40000 hours in the example of the present invention, but after 8000 hours in the comparative example. That is, the lifetime of brightness in the example of the present invention is five times longer than that in the comparative example.

Further, the organic EL device according to the present embodiment enables an improvement in resolution. That is, it is possible to increase the number of pixels having necessary colors in the predetermined region (the second display region 22), compared to the conventional structure in which the pixels for full color display are provided in the entire display region 2a, and thus it is possible to improve resolution.

Figure 30:
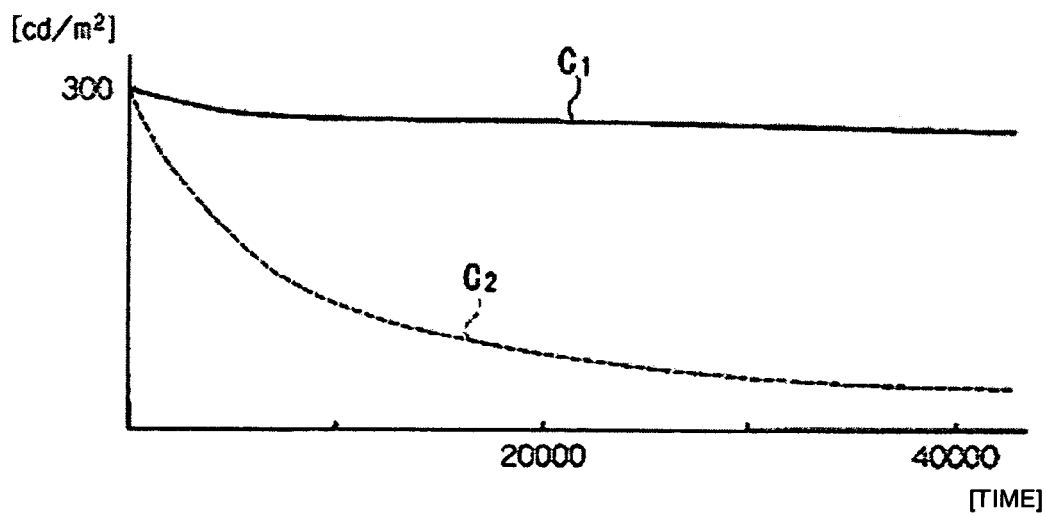
FIG. 30 is a graph illustrating a difference in brightness with the elapse of time between the existence and nonexistence of a lithium fluoride layer in the second display region.

Further, in the organic EL device according to the present embodiment, in the firs display region 21 the second display region obtained by dividing the display region 2a, the laminated structures of functional layers thereof constituting a pixel are different from each other. More specifically, in the first display region 21, the cathode 12 includes the lithium fluoride layer 12a. However, in the second display region, the cathode 12 does not include the lithium fluoride layer 12a. Therefore, the emission efficiency of each region increases. In the present embodiment, the variation of brightness with the elapse of time is measured in the case in which the cathode 12 includes the lithium fluoride layer 12a and in the case in which the cathode 12 does not include the second display region 22 in the second display region 22. The measured result is shown in FIG. 30. In FIG. 30, a character C1 indicates the case in which the cathode 12 includes the lithium fluoride layer 12a, and a character C2 indicates the case in which the cathode 12 does not include the lithium fluoride layer 12a. It is understood that the lifetime of brightness is greatly lengthened in the case in which the lithium fluoride layer 12a is not provided in the second display region 22 from the measured result.

Furthermore, in the organic EL device according to the present embodiment, the dummy display region 23 not having a light emitting function is provided in the boundary region between the first display region 21 and the second display region 22. The dummy display region 23 is composed of non-light-emitting dots (sub-pixels) A4 as described above, in which display is not performed. Since it is difficult to form the pixels in the boundary region as designed in manufacture, a problem arises in that the deterioration of contrast occurs in the boundary region. However, it is possible to prevent the deterioration of contrast by arranging the dummy display region 23 as in the present embodiment.

Moreover, in the present embodiment, the first display region 21 is used for full color display, and the second display region 22 is used for monochromatic display, but the present invention is not limited thereto. For example, the first display region 21 may be used for full color display, and the second display region 22 may be used for dichromatic display. Alternatively, the first display region 21 may be used for dichromatic display, and the second display region 22 may be used for full color display. In this way, it is possible to construct the display region 2a having a great variation. In the present embodiment, a white light emitting material may be used for monochromatic display in order to emit white light.

Further, in the present embodiment, the dummy display region 23 is provided in the boundary region between the first display region 21 and the second display region 22. However, for example, the dummy display region may be formed in the outer circumferential portion of the display region 2a. That is, since it is difficult to form the pixels in the outer circumferential portion of the display region 2a as designed in manufacture, a problem arises in that the deterioration of contrast occurs in the boundary region. However, it is possible to prevent the deterioration of contrast by providing the dummy display region 23 in the outer circumferential portion (see FIGS. 26 and 28).

(Method of Manufacturing Organic EL Device)

Next, a method of manufacturing an organic EL device will be described with reference to the accompanying drawings.

The manufacturing method of the present embodiment includes (1) a bank portion forming step, (2) a hole injecting/transporting layer forming step, (3) a light emitting layer forming step, (4) a cathode forming step, and (5) a sealing step. In addition, in the manufacturing method described in the present embodiment, other steps may be added, or some of the above-mentioned steps may be removed, if necessary.

Further, (2) the hole injecting/transporting layer forming step and (3) the light emitting layer forming step are performed by a liquid discharging method (an inkjet method) using a liquid discharging apparatus (an inkjet apparatus).

(1) Bank Portion Forming Step

Figure 11:
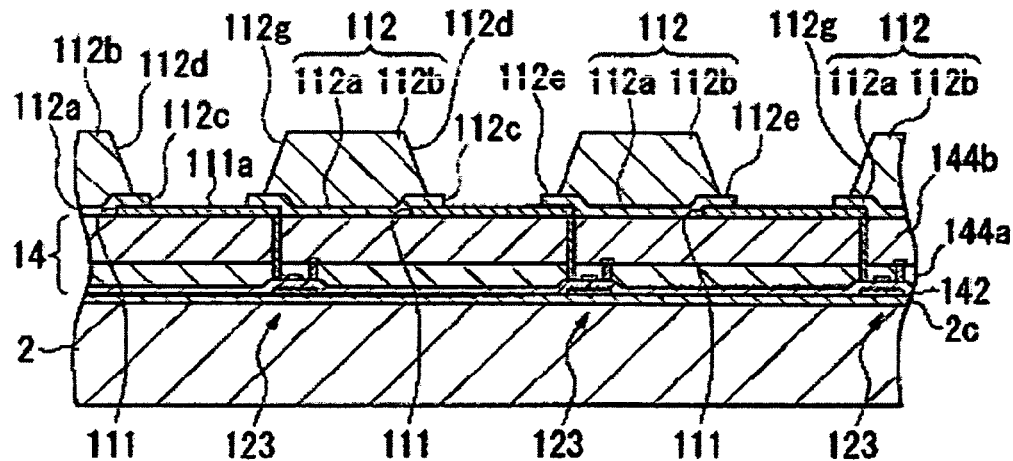
FIG. 11 is a flow diagram illustrating a manufacturing method according to the present invention.

In the bank portion forming step, as shown in FIG. 11, the bank portion 112 is formed at a predetermined position on the substrate 2. The bank portion 112 is formed in a laminated structure of the inorganic bank layer 112a, serving as the first bank layer, and the organic bank layer 112b, serving as the second bank layer.

(1)-1 Formation of Inorganic Bank Layer 112a

As shown in FIG. 11, first, the inorganic bank layer 112a is formed at a predetermined position on the substrate. The inorganic bank layer 112a is formed on the second interlayer insulating film 144b and the pixel electrode 111. In addition, the second interlayer insulating film 144b is formed on the circuit element portion 14 having the thin film transistors, the scanning lines, the signal lines, etc., thereon. The inorganic bank layer 112a can be made of an inorganic material, such as $SiO_2$ or $TiO_2$. These materials are formed by, for example, a CVD method, a coating method, a sputtering method, or a vacuum depositing method. In addition, the thickness of the inorganic bank layer 112a is preferably in the range of 50 nm to 200 nm, and more preferably, 150 nm.

The inorganic bank layer 112a is formed by forming an organic material on the interlayer insulating film 144 and the pixel electrodes 111 and by patterning the inorganic material using a photolithography method to form apertures therein. The apertures, serving as the lower apertures 112c, are provided corresponding to the positions where the electrode surfaces 111a of the pixel electrodes 111 are formed. In addition, the inorganic bank layer 112a is provided such that a portion thereof overlaps the outer circumferential portion of the pixel electrode 111, whereby the plane light emitting region of the light emitting layer 110 is controlled.

(1)-2 Formation of Organic Bank Layer 112b

Next, the organic bank layer 112b serving as the second bank layer is formed.

More specifically, as shown in FIG. 11, the organic bank layer 112b is formed on the inorganic bank layer 112a. The organic bank layer 112b can be made of a material having heat resistance and solvent resistance, such as an acrylic resin or a polyimide resin. The organic bank layer 112b is formed by applying the material and by patterning it using a photolithography method. In addition, the upper aperture 112d is formed in the organic bank layer 112b by the patterning. The upper aperture 112d is provided at the position corresponding to the electrode surface 111a and the lower aperture 112c to have a pattern common to all the pixels.

As shown in FIG. 11, the upper aperture 112d is preferably formed larger than the lower aperture 112c formed on the inorganic bank layer 112a in size. In addition, the organic bank layer 112b is preferably formed in a tapered shape in a sectional view, and the organic bank layer 112b is preferably formed such that the width of the bottom surface thereof is smaller than that of the pixel electrode 111 and the width of the top surface thereof is substantially equal to that of the pixel electrode 111.

In this way, the first laminated portion 112e surrounding the lower aperture 112c of the inorganic bank layer 112a protrudes from the organic bank layer 112b toward the center of the pixel electrode 111. As such, the upper aperture 112d formed in the organic bank layer 112d communicates with the lower aperture 112c formed in the inorganic bank layer 112a, so that an aperture 112g is formed to pass through the inorganic bank layer 112a and the organic bank layer 112b.

A proper surface treatment is preferably performed on the surfaces of the bank portions 112 and the pixel electrodes 111 by a plasma process. More specifically, a lyophobic process is performed on the surfaces of the bank portions 112, and a lyophilic process is performed on the surfaces of the pixel electrodes 111. The surface treatment of the pixel electrodes 111 is performed by an $O_2$ plasma process in which oxygen is used as raw gas under the conditions, such as at a plasma power of 100 kW to 800 kW, a flux of oxygen of 50 ml/min to 100 ml/min, a plate conveying speed of 0.5 mm/sec to 10 mm/sec, and a substrate temperature of 70° to 90°. In this way, it is possible to make the surfaces of the pixel electrodes 111 have a lyophilic property. In addition, the cleaning of the surfaces of the pixel electrodes 111 and the adjustment of a work function are simultaneously performed by the $O_2$ plasma process. Then, the surface treatment of the bank portions 112 can be performed by a $CF_4$ plasma process using tetrafluoromethane under the conditions, such as at a plasma power of 100 kW to 800 kW, a flux of tetrafluoromethane gas of 50 ml/min to 100 ml/min, a plate conveying speed of 0.5 mm/sec to 10 mm/sec, and a substrate temperature of 70° to 90°. In this way, it is possible to make the upper aperture 112d and the top surface 112f of the bank portion 112 have a lyophobic property.

(2) Hole Injecting/Transporting Layer Forming Step

Next, in the light emitting element forming step, first, the hole injecting/transporting layer is formed on the pixel electrodes 111.

In the hole injecting/transporting layer forming step, a liquid composition containing a material for forming the hole injecting/transporting layer is discharged onto the electrode surfaces 111a by using, for example, an inkjet apparatus, which is a kind of liquid discharging apparatus. Subsequently, a drying process and a heating process are performed thereon to form the hole injecting/transporting layer 110a on the pixel electrodes 111 and the inorganic bank layers 112a. Here, the hole injecting/transporting layer 110a is formed on the first laminated portion 112e, that is, the hole injecting/transporting layer is formed on only the pixel electrodes 111.

Figure 12:
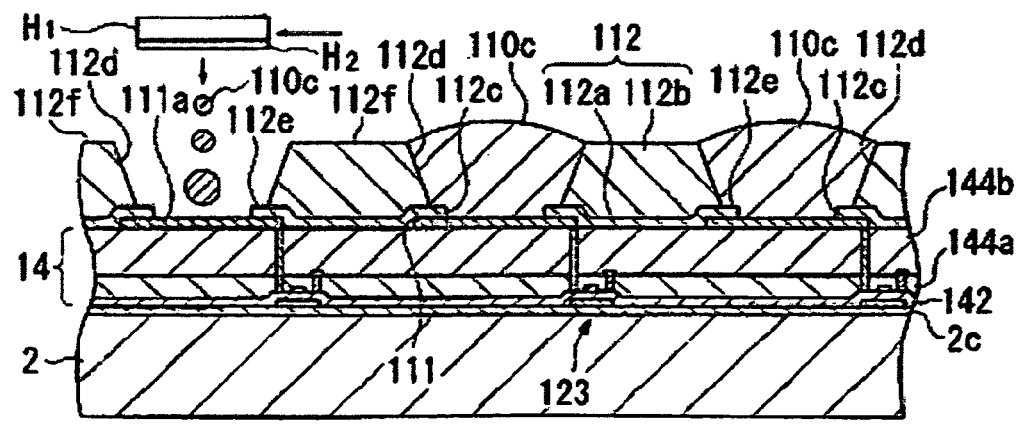
FIG. 12 is a flow diagram illustrating the manufacturing method according to the present invention.

A manufacturing method by an inkjet manner is as follows. That is, as shown in FIG. 12, a liquid composition containing the material for forming the hole injecting/transporting layer is discharged from a plurality of nozzles formed in an inkjet head H1. In the present embodiment, the composition is filled up in each pixel by moving the inkjet head. However, the composition may be filled up therein by moving the substrate 2. In addition, in the present embodiment, the head is moved in the vertical direction with respect to the substrate 2.

The inkjet head discharges the liquid composition as follows. That is, a discharging nozzle H2 formed in the inkjet head H1 is arranged opposite to the electrode surface 111a, and the liquid composition is discharged from the nozzle H2. The bank portion 112 for partitioning the lower apertures 112c is formed around the pixel electrode 111, and the inkjet head H1 is arranged opposite to the pixel electrode surface 111a positioned in the lower aperture 112c. Then, a droplet 110c of the liquid composition corresponding to a drop of liquid is discharged from the discharging nozzle H2 onto the electrode surface 111a.

As the liquid composition used in the present embodiment, a composition obtained by dissolving a mixture of a polythiophene derivative, such as polyethylenedioxythiophene (PEDOT), and a polysthylenesulfonic acid (PSS) in a polar solvent can be used. The polar solvent includes, for example, glycol ethers, such as isopropyl alcohol (IPA), normal butanol, γ-butyrolactone, N-methyl pyrrolidone (NMP), 1,3-dimethyl-2-imidazolidinone (DMI) and its derivative, carbitolacetate, butyl carbitolacetate, and the like.

For a more specific composition, conditions, such as a PEDOT/PSS mixture (PEDOT/PSS=1:20): 12.52 weight %, IPA: 10 weight %, NMP: 27.48 weight %, DMI: 50 weight %, can be exemplified. Here, the viscosity of the liquid composition is preferably in the range of 1 mpa·s to 20 mpa·s, and more preferably, in the range of 4 mpa·s to 15 mpa·s.

Further, it is possible to stably discharge the liquid composition without clogging the nozzle H2. In addition, the same material may be used for the R, G, and B light emitting layers 110b1 to 110b3 as a material for forming the hole injecting/transporting layer. Also, different materials can be used for the respective color light emitting layers as the material for forming the hole implantation/transportation layer.

The discharged droplet 110c of the composition is spread on the lyophilic electrode surface 111a and first laminated portion 112e to be filled up in the lower and upper apertures 112c and 112d. Even when the droplet 110c of the first composition 110c is discharged from a predetermine discharging position onto the top surface 112f, the top surface 112f repels the droplet 110c of the first composition without absorption, so that the droplet 110c of the first composition rolls into the lower and upper apertures 112c and 112d.

The amount of the composition discharged onto the electrode surface 111a is determined by the sizes of the lower and upper apertures 112c and 112d, the thickness of the hole injecting/transporting layer to be formed, the concentration of the material for forming the hole injecting/transporting layer in the liquid composition, etc. In addition, the droplet 110c may be discharged onto the same electrode surface 111a several times, not one time. In this case, the amount of the liquid composition discharged one time may be the same, or may be changed whenever the liquid composition is discharged. The liquid composition may be discharged at different positions, not at the same position, in the electrode surface 111a whenever discharging is performed.

Figure 22:
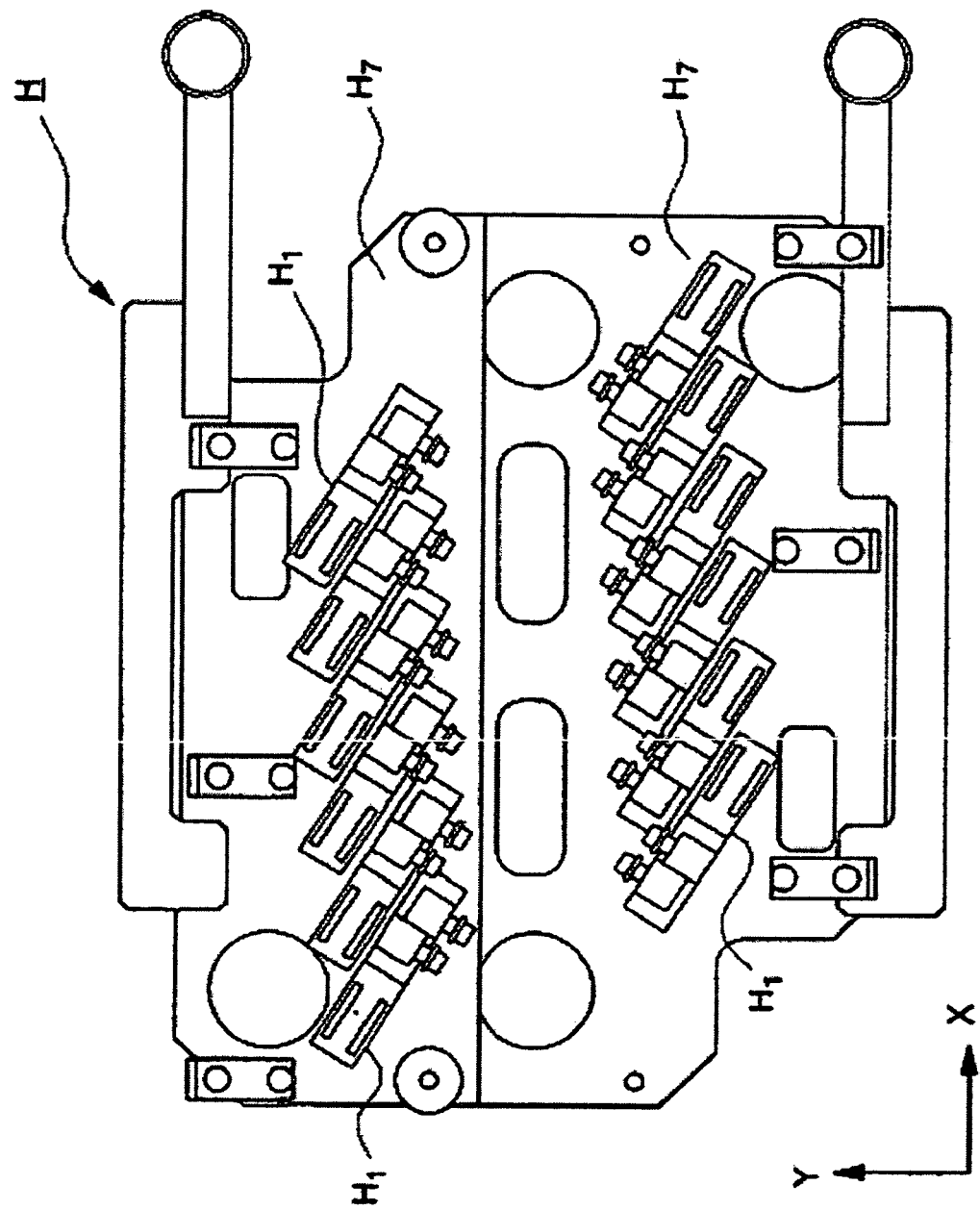
FIG. 22 is a view illustrating the plane structure of a head according to the present invention.
Figure 23:
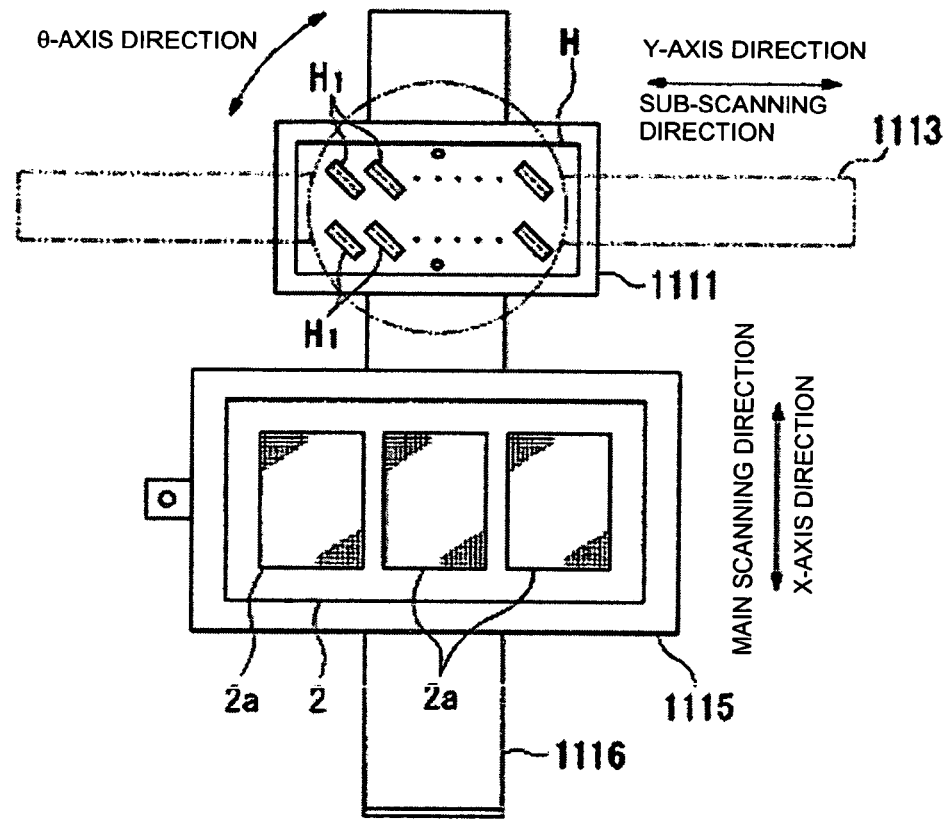
FIG. 23 is a view illustrating the plane structure of an inkjet apparatus according to the present invention.

Further, the head H shown in FIG. 22 can be used as the inkjet head. It is preferable that the substrate and the inkjet head be arranged as shown in FIG. 23. In FIG. 22, reference numeral H7 indicates a supporting substrate for supporting the inkjet head H1; and a plurality of the inkjet heads H1 is provided on the substrate H7. A plurality of discharging nozzles (for example, a total of 360 nozzles is arranged in two rows, each row including 180 nozzles) are provided on the ink discharging surface (opposite to the substrate) of the inkjet head H1 in two rows along the lengthwise direction of the head, and the two rows are separated from each other in the widthwise direction. In addition, a plurality of the inkjet heads H1 are arranged on a supporting plate 20 having a substantially rectangular shape in plan view in two rows along the X direction, with the discharging nozzles facing the substrate. Here, the respective inkjet heads H1 are inclined at a predetermined angle with respect to the X-axis (or the Y-axis), and the two rows are separated from each other in the Y direction.

In FIG. 23, reference numeral 1115 indicates a stage for mounting the substrate 2, and reference numeral 1116 indicates a guide rail for guiding the stage 1115 in the x-axis direction (the main scanning direction) of FIG. 23. In addition, the head H is movable in the y-axis direction (the sub-scanning direction) of FIG. 23 by means of a supporting member 1111 along the guide rail 1113 and can be rotated in the θ-axis direction of FIG. 23, so that the inkjet head H1 can be inclined at a predetermined angle with respect to the main scanning direction. Therefore, it is possible to make the pitch between the nozzles correspond to the pitch between the pixels by arranging the inkjet head to be inclined with respect to the scanning direction. In addition, it is possible to cope with the pitch between the pixels by adjusting the inclination angle.

The substrate 2 shown in FIG. 23 is formed by arranging a plurality of chips on a mother substrate. That is, the region of one chip corresponds to one display device. In the present embodiment, three display regions 2a are formed, but the present invention is not limited thereto. For example, when the composition is discharged onto the display region 2a located at the left side of the substrate 2, the composition is scanned to the substrate 2 while the head H is being moved to the left side of FIG. 23 along the guide rail 1113 and the substrate 2 is being moved in the upper direction of FIG. 23 along the guide rail 1116. Then, the head H is moved to the right side of FIG. 23 to discharge the composition onto the display region 2a at the center of the substrate. The same operation is performed on the display region 2a located at the right end. In addition, the head H shown in FIG. 22 and the inkjet apparatus shown in FIG. 23 can be used for the light emitting layer forming step as well as the hole injecting/transporting layer forming step.

Figure 13:
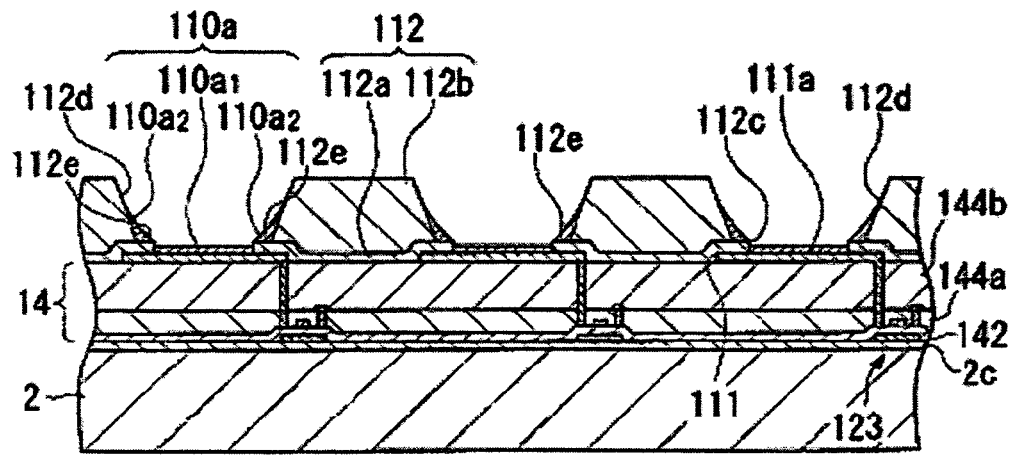
FIG. 13 is a flow diagram illustrating the manufacturing method according to the present invention.

Next, a drying process as shown in FIG. 13 is performed. That is, the discharged first composition is dried, and a solvent which is included in the first composition is evaporated, thereby forming the hole injecting/transporting layer 110a. When the drying process is performed, the solvent included in the liquid composition is mainly evaporated near the inorganic bank layer 112a and the organic bank layer 112b. Together with the evaporation of the solvent, the material for forming the hole injecting/transporting layer is condensed and extracted. In this way, a circumferential portion 110a2 made of the material for forming the hole injecting/transporting layer is formed on the first laminated portion 112e as shown in FIG. 13. The circumferential port 110a2 is tightly attached on the wall surface (the organic bank layer 112b) in the upper aperture 112d. The thickness of the circumferential portion 110a2 is thin near the electrode surface 111a and thick near the organic bank layer 112b separated from the electrode surface 111a.

Also, simultaneously, the solvent is evaporated on the electrode surface 111a in the drying process. Therefore, a flat portion 110a1 made of the material for forming hole injecting/transporting layer is formed on the electrode surface 111a. Since the evaporation speed of the solvent is approximately uniform on the electrode surface 111a, the material for forming the hole injecting/transporting layer 1 is uniformly condensed on the electrode surface 111a. Accordingly, a flat portion 110a1 having a uniform thickness is formed. In this way, the hole injecting/transporting layer 110a composed of the circumferential portion 110a2 and the flat portion 110a1 is formed. In addition, the positive hole injecting/transporting layer may be formed only on the electrode surface 111a, not on the circumferential portion 110a2.

The above-mentioned drying process is performed, for example, in a nitrogen atmosphere at a pressure of 133.3 Pa (1 Torr) at room temperature. If the pressure is too low, it is not preferable because the droplet 110c of the first composition is bumped. If temperature is higher than the room temperature, the evaporation speed of the polar solvent increases. Therefore, it is impossible to form a flat layer. After the drying process, it is preferable to remove the polar solvent or water remaining in the hole injection/transporting layer 110a by heating the hole injection/transporting layer 110a in a nitrogen atmosphere or under vacuum condition at a temperature of 200° C. for about ten minutes.

(3) Light Emitting Layer Forming Step

The light emitting layer forming step includes a process of discharging a light emitting layer forming material and a drying process.

Similar to the above-mentioned hole injecting/transporting layer forming step, a liquid composition for forming the light emitting layer is discharged on the hole injecting/transporting layer 110a by the inkjet method. Thereafter, a drying process (and a thermal treatment) is performed on the discharged liquid composition to form the light emitting layer 110b on the hole injecting/transporting layer 110a.

Figure 14:
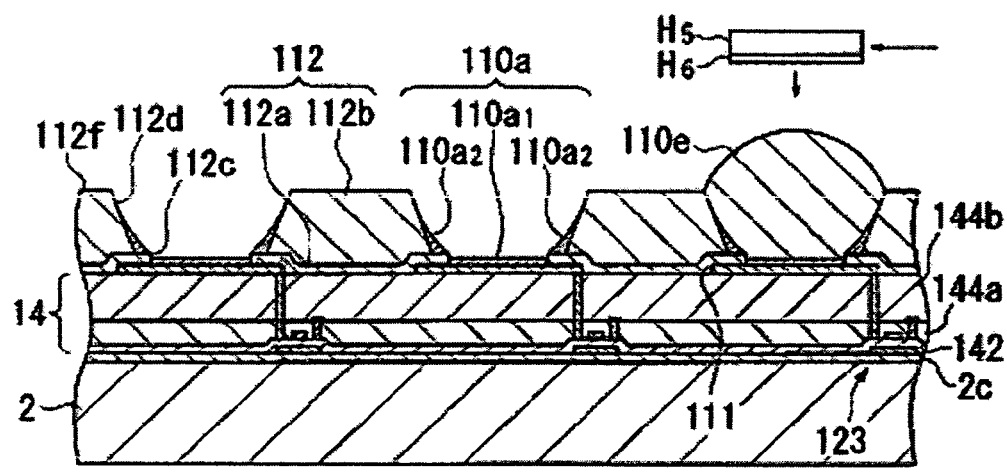
FIG. 14 is a flow diagram illustrating the manufacturing method according to the present invention.

FIG. 14 shows a process of discharging the liquid composition containing the light emitting layer forming material by the inkjet method. As shown in FIG. 14, an inkjet head H5 is relatively moved to the substrate 2, so that the liquid composition containing the material for forming each color (for example, blue (B) in the present embodiment) light emitting layer is discharged from discharging nozzles H6 formed in the inkjet head.

In the discharging process, the inkjet head H5 discharges the liquid composition, with the discharging nozzles facing the hole injecting/transporting layer 110a position in the upper and lower apertures 112c and 112d, while relatively moving to the substrate 2. The amount of liquid per drop discharged from the discharging nozzle H6 is controlled. The droplet whose amount is controlled is discharged from the discharging nozzle on the hole injecting/transporting layer 110a.

In the present embodiment, as shown in FIG. 2, the dot pattern of the respective colors in the first display region 21 is different from that in the second display region 22. Therefore, discharging is performed on the respective regions by different methods.

Figure 15:
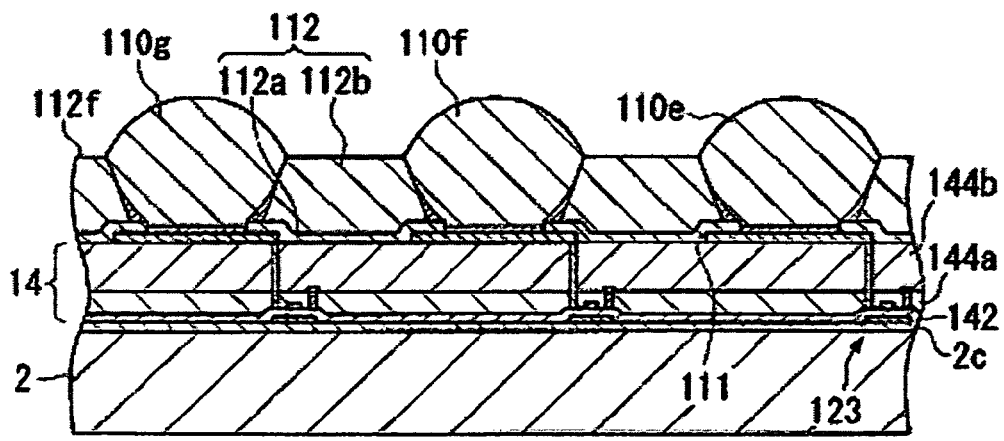
FIG. 15 is a flow diagram illustrating the manufacturing method according to the present invention.

In the display region 21, as shown in FIG. 15, in a state in which the droplet 110e of the liquid composition dropped on the substrate 2 is not dried, droplets 110f and 110g of the liquid composition containing the materials for forming different color light emitting layers are discharged. Meanwhile, in the second display region 22, a droplet 110g of the liquid composition containing a material for forming the red light emitting layer is discharged. That is, in the present embodiment, since the discharging process is performed by the inkjet method, it is possible to selectively discharge the liquid composition having a predetermined color onto predetermined dots.

As shown in FIG. 15, the discharged liquid droplets 110e to 110g are respectively spread on the hole injecting/transporting layer 110a and are then filled up in the lower and upper apertures 112c and 112d. Further, even when the respective liquid droplets 110e to 110g are discharged onto the top surfaces 112f on which a lyophobic process has been performed, deviating from predetermined positions, the liquid droplets 110e to 110g roll into the lower and upper apertures 112c and 112d without being absorbed into the top surfaces 112f.

Furthermore, as described above, the dummy display region 23 is formed in the boundary region between the first display region 21 and the second display region 22, and the non-light-emitting dots A4 (see FIG. 5) constituting the dummy display region 23 each have the aperture 112g surrounded by the bank portion 112. The liquid droplets are not discharged onto the non-light-emitting dots A4, and thus the light emitting layer is not formed therein.

As described above, the liquid composition containing the materials for forming R, G, and B light emitting layers is discharged in the first display region 21, and the liquid composition containing the material for forming only the R light emitting layer is discharged in the second display region 22. In this case, when the first display region 21 and the second display region 22 are consecutively formed, there is a fear that a mixture of colors or the delay of discharging from the inkjet head will occur. However, in the present embodiment, the dummy display region 23 is formed, and the non-light-emitting dots A4 are formed therein. Therefore, it is possible to prevent or suppress the generation of a defect in display caused by the mixture of color or the delay of discharging. In addition, it is preferable to provide a light shielding portion so as to overlap the non-light-emitting dots A4 in plan view.

The light emitting layer forming material used in the present embodiment includes, for example, polyfluorene-based polymer derivatives, (poly) paraphenylenevinylene derivative, polyphenylene derivative, polyvinylcarbazole, polythiophene derivative, perylene-based pigment, coumarin-based pigment, rhodamine-based pigment, or materials obtained by doping an organic EL material into the above-mentioned polymer. For example, polymer materials obtained by doping rubrene, perylene, 9,10-diphenylanthracene, tetraphenylbutadiene, nile red, coumarin 6, and quinacridon can be used. In addition, as a solvent for dissolving or dispersing these light emitting layer forming materials, the same kind of material is used for each color light emitting layer.

Figure 16:
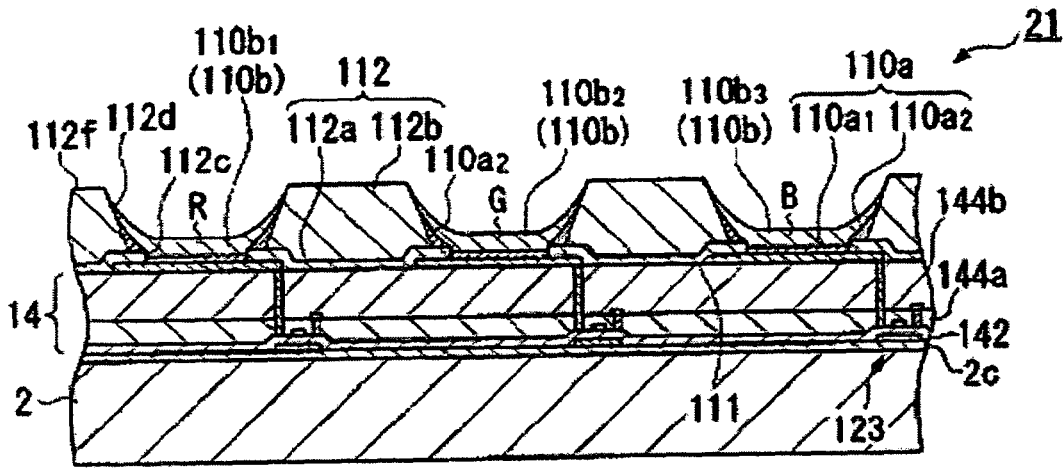
FIG. 16 is a flow diagram illustrating a process of forming the first display region in the manufacturing method according to the present invention.

Next, the drying process is performed. In the first display region 21, after the liquid droplets 110e to 110g for the respective colors are dropped at the predetermined positions, the drying process is collectively performed thereon to form the light emitting layers 110b1 to 110b3. That is, the solvent contained in the liquid droplets 110e to 110g are evaporated by drying, so that the red (R) light emitting layer 110b1, the green (G) light emitting layer 110b2, the blue (B) light emitting layer 110b3 are formed as shown in FIG. 16. In addition, only three light emitting layers respectively emitting R, G, and B light components are shown in FIG. 16. However, as can be apparently seen from FIG. 2 or other figures, the light emitting elements are practically formed in a matrix, so that a plurality of light emitting layers (not shown) are additionally formed (to correspond to the respective colors).

Figure 17:
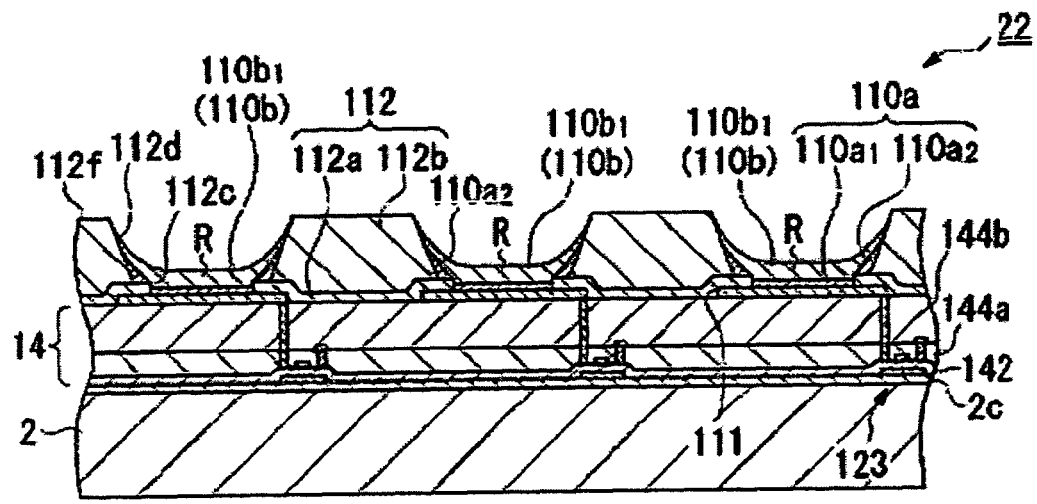
FIG. 17 is a flow diagram illustrating a process of forming the second display region in the manufacturing method according to the present invention.
Figure 18:
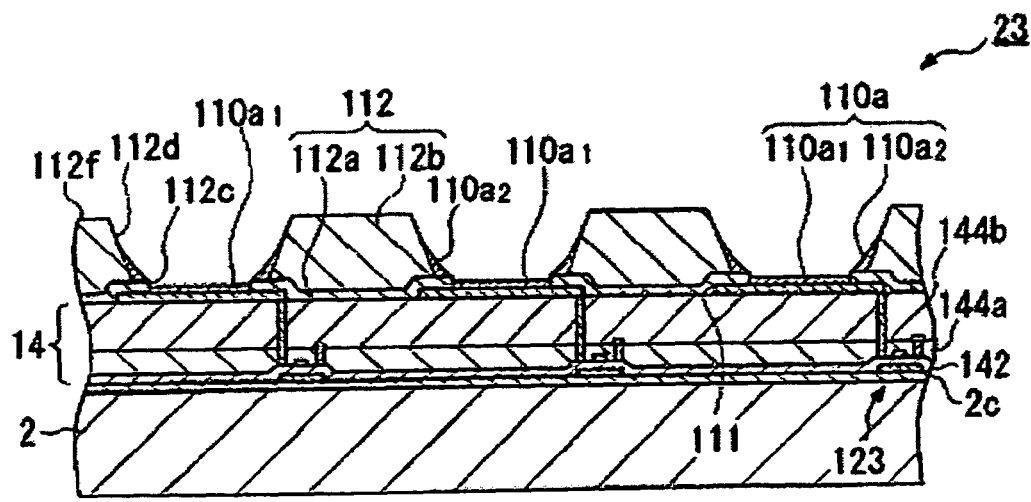
FIG. 18 is a flow diagram illustrating a process of forming the dummy display region in the manufacturing method according to the present invention.

Meanwhile, in the second display region 22, after the liquid droplets 110g for red are dropped, the drying process is collectively performed thereon to form the light emitting layer 110b1. That is, the solvent contained in the liquid droplets 110g is evaporated by drying, so that the red (R) light emitting layer 110b as shown in FIG. 17 is formed. In addition, in the dummy display region 23, the light emitting layer 110b is not formed at all, as shown in FIG. 18.

In the drying process, the liquid composition is preferably dried by a vacuum drying method. More specifically, the drying process of the liquid composition can be performed in a nitrogen atmosphere at a pressure of 133.3 Pa (1 Torr) at room temperature. If the pressure is too low, the liquid composition is undesirably bumped. If the temperature is higher than the room temperature, the evaporation speed of the solvent increases, which is not preferable since a large amount of the light emitting layer forming material adheres to the wall surface of the upper aperture 112d.

Subsequently, when the driving process is completed, it is preferable to perform an annealing process on the light emitting layer 110b using heating means, such as a hot plate. The annealing process is performed at a common temperature and for a common time where the maximum of emission characteristics can be obtained from each organic EL layer.

In this way, the hole injecting/transporting layer 110a and the light emitting layer 110b are formed on the pixel electrode 111.

(4) Cathode Forming Step

Figure 19:
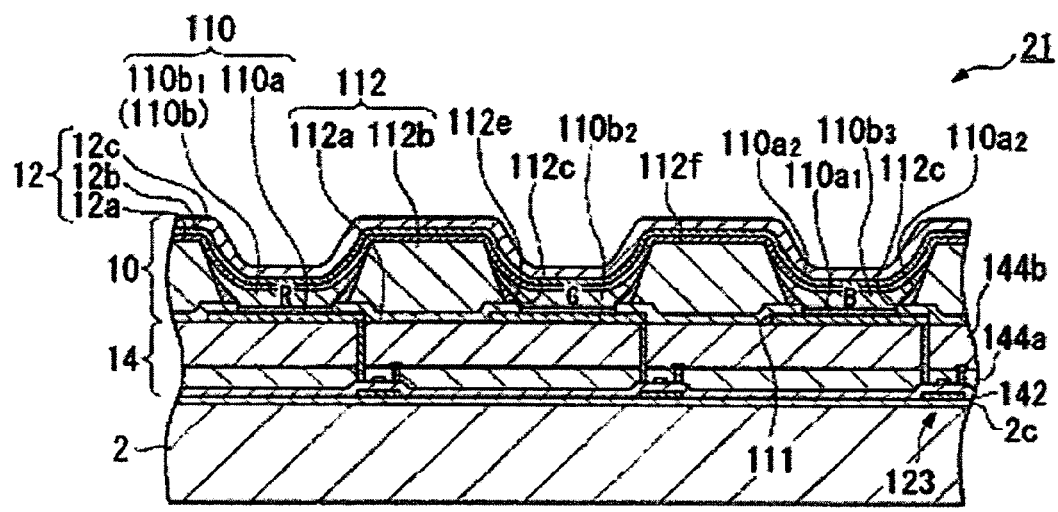
FIG. 19 is a flow diagram illustrating the process of forming the first display region in the manufacturing method according to the present invention.
Figure 20:
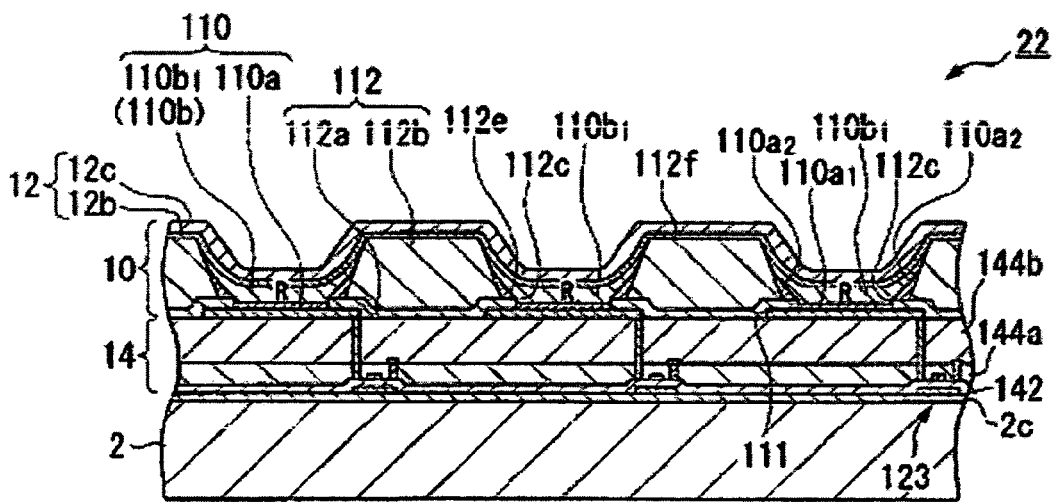
FIG. 20 is a flow diagram illustrating the process of forming the second display region in the manufacturing method according to the present invention.
Figure 21:
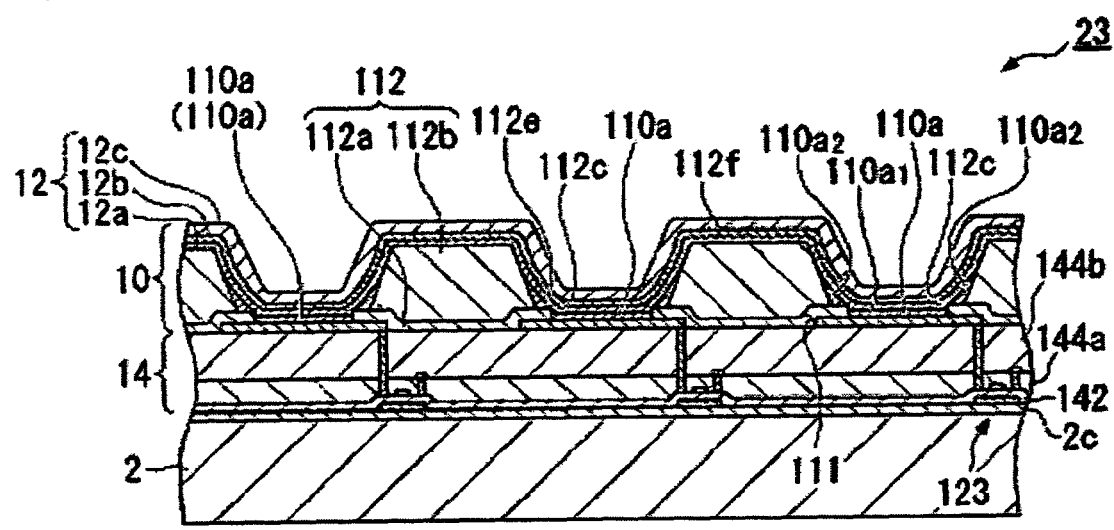
FIG. 21 is a flow diagram illustrating the process of forming the dummy display region in the manufacturing method according to the present invention.

Next, the cathode 12 is formed opposite to the pixel electrode (anode) 111 in the first display region 21 and the second display region 22 as shown in FIGS. 19, 20, and 21.

That is, in the first display region 21, first, the lithium fluoride layer 12a is formed on the entire region on the substrate 2 including the respective light emitting layers 110b and the organic bank layer 112b shown in FIG. 19, and then the calcium layer 12b and the aluminum layer 12c are sequentially formed thereon. In addition, the respective layers made of a metallic material are preferably formed by, for example, a vapor depositing method, a sputtering method, or a CVD method and more preferably, by the vapor depositing method, from the viewpoint of preventing the damage of the light emitting layer 110b caused by heat.

Meanwhile, in the second display region 22, first, the calcium layer 12b is formed on the entire region on the substrate 2 including the respective light emitting layers 110b and the organic bank layer 112b shown in FIG. 20, and the aluminum layer 12c is then formed thereon. In this case, the respective layers are preferably formed by, for example, the vapor depositing method, the sputtering method, or the CVD method, and more preferably, by the vapor depositing method, from the viewpoint of preventing the damage of the light emitting layer 110b caused by heat.

Further, in the dummy display region 23, similar to the first display region 21, first, the lithium fluoride layer 12a is formed on the entire region on the substrate 2 including the hole injecting/transporting layer 110a and the organic bank layer 112b shown in FIG. 21, and then the calcium layer 12b and the aluminum layer 12c are sequentially formed thereon. In addition, the respective layers made of a metallic material are preferably formed by, for example, the vapor depositing method, the sputtering method, or the CVD method.

In this way, the cathode 12 is formed on the entire region including the first display region 21, the second display region 22, and the dummy display region 23. In addition, the organic EL elements corresponding to the respective colors R, G, and B are formed in the first display region 21, and the organic EL elements corresponding to red are formed in the second display region 22. On the other hand, no organic EL element is formed in the dummy display region 23 in practice. Further, a protective film made of $SiO_2$ or SiN for preventing oxidation may be formed on the cathode 12.

(5) Sealing Step

Finally, the substrate 2 having the organic EL elements thereon is sealed with a sealing substrate separately prepared with a sealing resin interposed therebetween. For example, the sealing resin composed of a thermosetting resin or an ultraviolet ray curable resin is applied on the circumferential portion of the substrate 2, and the sealing substrate is then arranged on the sealing resin. In addition, it is preferable to perform the sealing process in an inert gas, such as nitrogen, argon, or helium. When the sealing process is performed in the air, a defect, such as a pinhole, may occur in the cathode 12. In this case, there is a fear that water or oxygen will be permeated into the cathode 12 through the defective portion, resulting in the oxidation of the cathode 12.

Thereafter, the cathode 12 is connected to the wiring lines of the substrate 2, and the wiring lines of the circuit element portion 14 are connected to a driving IC (driving circuit) provided on the substrate or at the outside, thereby forming the organic EL device according to the present embodiment.

As described above, it is possible to properly form the non-light-emitting dots A4 of the organic EL device according to the present embodiment by discharging no liquid composition in the boundary region between the first display region and the second display region by a liquid discharging method using an inkjet apparatus. That is, since different liquid compositions are respectively discharged in the first display region 21 and the second display region 22, it is easy that liquid droplets are unstably discharged in the boundary region when a liquid discharging method is used, which causes the thickness of a functional layer to be nonuniform. In this case, the contrast of a display device may be deteriorated. In addition, when the non-light-emitting dots A4 are formed in the boundary region by discharging no liquid composition in the apertures 112g of the boundary region, it is possible to prevent or suppress the deterioration of contrast in a manufactured display device.

Further, in the present embodiment, the inkjet head is moved in the vertical direction of the substrate 2 in FIG. 2. However, the inkjet head may be moved in the horizontal direction of FIG. 2. In this case, the dummy display region 23 may be formed in the boundary region between the first display region 21 and the second display region 22 in a direction intersecting the scanning direction (that is, in the direction of a boundary line extending the vertical direction in FIG. 2).

Figure 26:
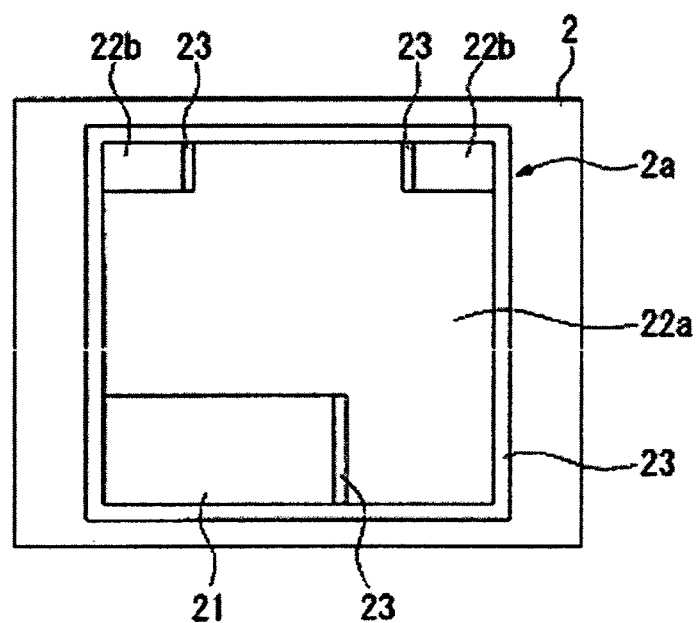
FIG. 26 is a plan view illustrating the structure of display regions of the display unit shown in FIG. 24.
Figure 27:
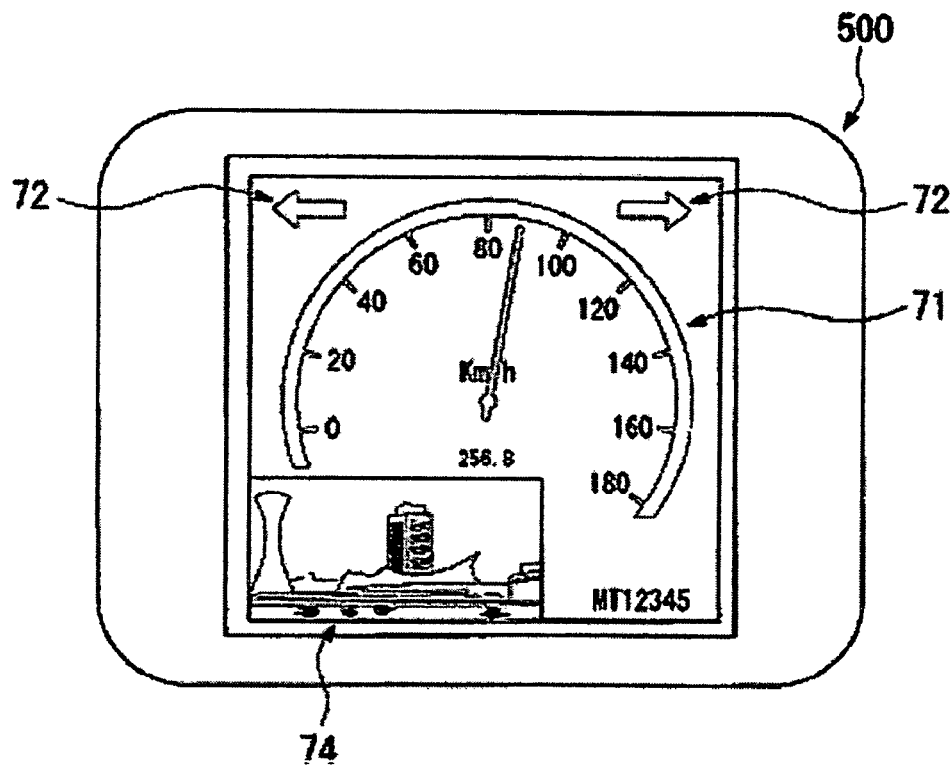
FIG. 27 is a plan view illustrating an example of an electronic apparatus.
Figure 28:
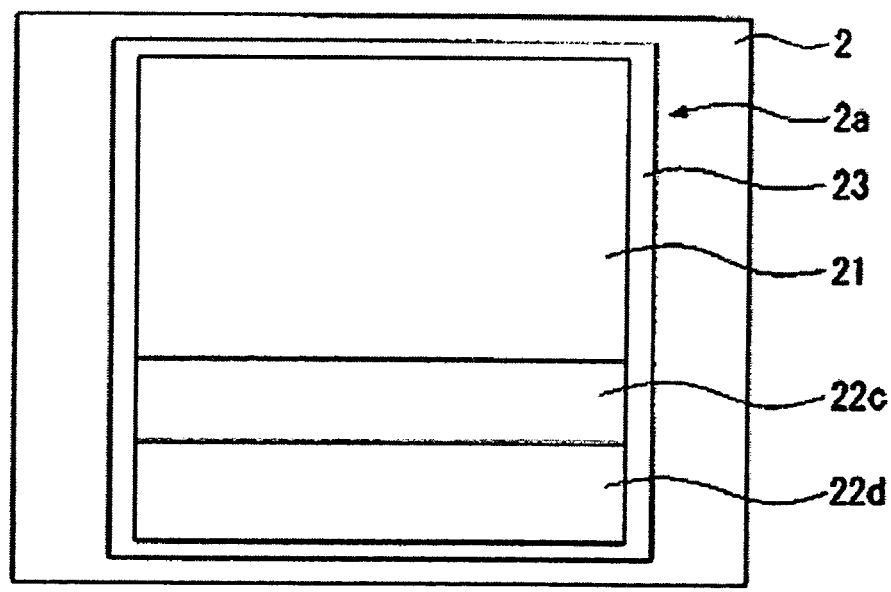
FIG. 28 is a plan view illustrating a modification of the substrate constituting the display unit that is mounted on an electronic apparatus.

Furthermore, the dummy display region 23 may be formed in the outer circumferential portion of the display region 2a (see FIGS. 26 and 28). That is, in the drying process, the evaporating speed of a solvent is higher in the outer circumferential portion of the display region 2a than inside the display region 2a, it is difficult to form pixels as designed, which results in the deterioration of contrast. However, it is possible to prevent or suppress the deterioration of contrast by providing the dummy display region 23 in the outer circumferential portion (see FIGS. 26 and 28).

(Electronic Apparatus)

Next, an electronic apparatus using the display device according to the present invention will be described.

Figure 24:
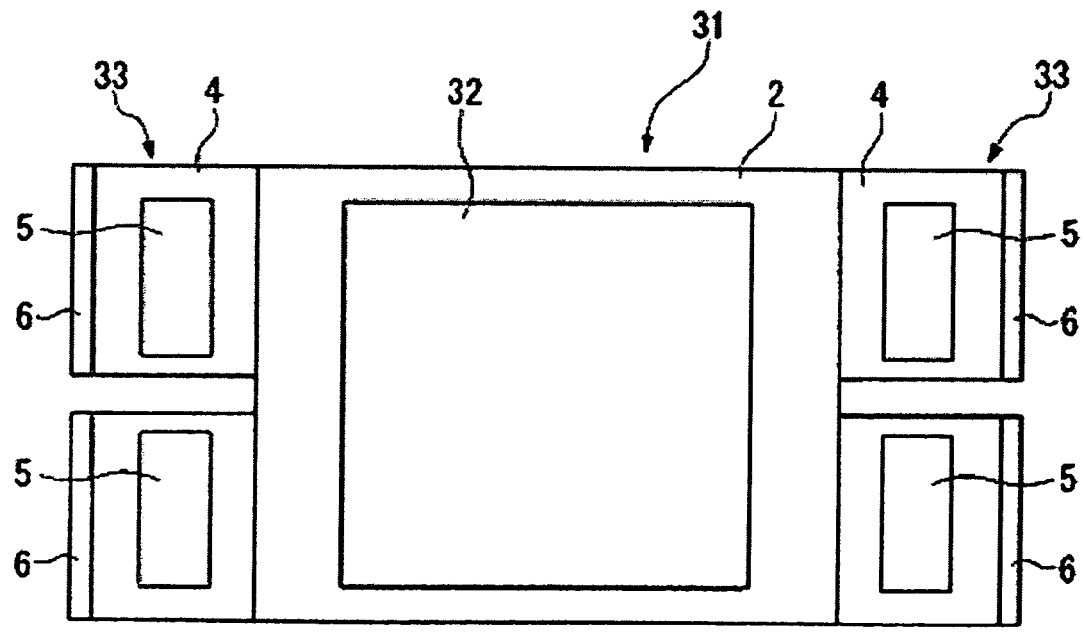
FIG. 24 is a plan view illustrating an example of a substrate constituting a display unit that is mounted to an electronic apparatus.
Figure 25:
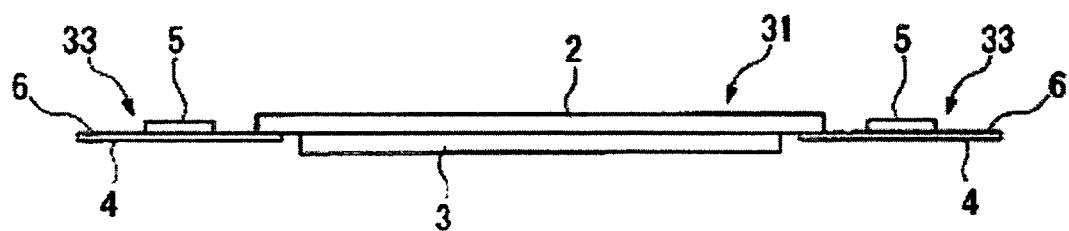
FIG. 25 is a cross-sectional view illustrating the sectional structure of the display unit shown in FIG. 24.

First, an embodiment in which a display device having the same structure as the organic EL device according to the above-mentioned embodiment is used for a display unit of an installment panel will be described. FIG. 24 is a plan view schematically illustrating the structure of a substrate for the display unit provided in the installment panel, and FIG. 25 is a cross-sectional view schematically illustrating the structure of the substrate for the display unit.

The display unit is mainly composed of a main body 31 in which an organic EL layer is interposed between the substrate 2 having TFTs thereon and a sealing glass substrate 3, and a display surface 32 is provided at the center of the main body 31. In addition, external connection portions 33 having flexible substrates 4 connected to the substrate 2 and data line driving ICs 5 provided on the flexible substrate 4 are connected to the main body 31, and external connection terminals 6 are provided at one end of each of the external connection portions 33.

Further, a transistor array is formed on the substrate 2, and a data holding circuit and a scanner driver are also mounted on the substrate 2. In addition, data lines, control lines, power lines, etc., are formed on the flexible substrate 4, and the data line driving IC has a function of supplying data to each dot (sub-pixel). Furthermore, the external connection terminals 6 include terminals for receiving power from a power substrate and terminals for receiving control signals from an external control substrate.

Meanwhile, FIG. 26 is an explanatory view illustrating the structure of a display region of the mounted display unit. The organic EL device shown in FIG. 2 has two display regions having different color display ranges. However, the display region 2a of the display unit according to the present embodiment includes a red display region 22a capable of displaying only red, a blue display region 22b capable of displaying only blue, and a full-color display region 21 capable of performing full color display. In the present embodiment, the dummy display region 23 is provided in the boundaries between the respective display regions, and a region performing no display, that is, a pixel region not having a light emitting layer at all, is formed therein.

Furthermore, three pixels (that is, nine dots (sub-pixels)) are formed in the dummy display region 23 in the widthwise direction thereof. In addition, the display region 2a of the display unit includes 560 by 560 pixels as a whole, and one pixel has three dots (sub-pixels). In addition, the dummy display region 23 is also formed in the outer circumferential portion of the display region 2a.

The display unit having the above-mentioned structure is mounted on an installment panel portion 500. More specifically, the flexible substrate 4 is incorporated into the installment panel 500. The red display region 22a is used for a display unit 71 of a speedometer for indicating speed and is always turned on when a car is in use. Meanwhile, the blue display region 22b is used for a necessary information display unit 72 for displaying information necessary for driving and is turned on at the timing when the information is output. In addition, the full-color display region 21 is used for an arbitrary information display unit 74 for displaying incidental information, such as navigation information from a navigation system or external information from a camera mounted on a vehicle.

Figure 29:
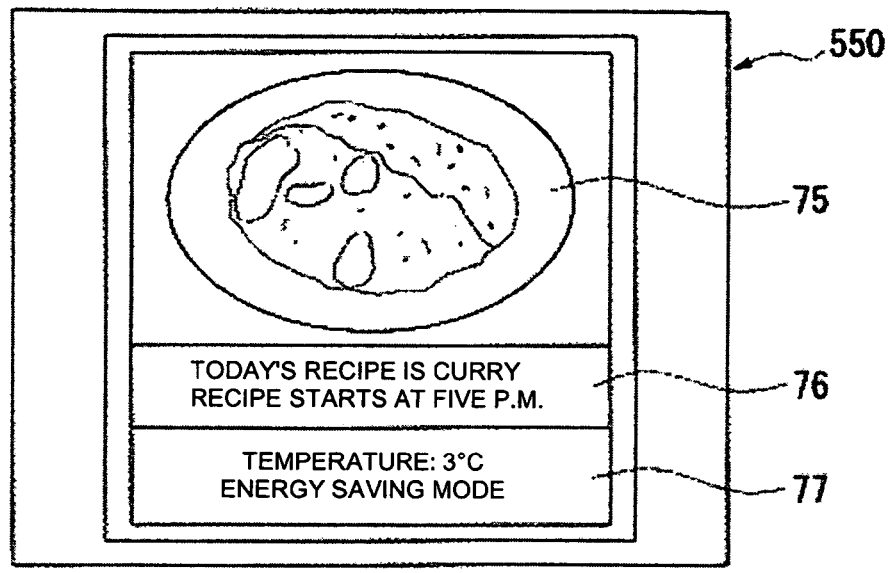
FIG. 29 is a plan view illustrating an example of an electronic apparatus.

Next, an embodiment in which a display device having the same structure as the organic EL device according to the above-mentioned embodiment is used for a display unit of a household appliance will be described. FIG. 28 is a plan view schematically illustrating the structure of a display panel mounted on a refrigerator, and FIG. 29 is a plan view illustrating a usage mode thereof. In addition, the structure of a substrate in the display panel is similar to that used for the installment panel, and thus a description thereof will be omitted.

The display region 2a of the display panel used in the present embodiment includes a full-color display region 21 capable of performing full-color display, an orange display region 22c capable of displaying orange, and a red display region 22d capable of displaying red. In addition, the orange display region 22c is composed of pixels each having two red dots (sub-pixels) and one green dot (sub-pixel). Further, the dummy display region 23 is formed in a circumferential portion of the display region 2a.

The display panel having the above-mentioned structure is mounted to a display unit 550 of the refrigerator shown in FIG. 29. More specifically, the red display region 22d is used for an operating state display unit 77 for displaying an operating state other than temperature, and the orange display region 22c is used for a service information display unit 76 for displaying service information, on which a daily recipe is displayed. In addition, the full-color display region 21 is used for an image display unit 75 for displaying image information incidental to the service information.

According to the above-mentioned electronic apparatus, the variation of display increases, and the display device according to the present invention is provided to the electronic apparatus. Therefore, it is possible to perform high-quality display and to lengthen the lifetime of an electronic apparatus.

What is claimed is:

1. A method of manufacturing a display device which is provided with a first region, a second region, and a third region formed between the first and second regions, in which a plurality of pixel electrodes are provided in each of the first, second, and third regions, a first light-emitting layer emitting a first color is formed on the plurality of pixel electrodes positioned in the second region, the second region being a monochromatic display region, a second light-emitting layer emitting a red color is formed on a first pixel electrode of the plurality of pixel electrodes positioned in the first region, a third light-emitting layer emitting a green color is formed on a second pixel electrode of the plurality of pixel electrodes positioned in the first region, a fourth light-emitting layer emitting a blue color is formed on a third pixel electrode of the plurality of pixel electrodes positioned in the first region, the first region being a color display region, and a light-emitting layer is not formed on the plurality of pixel electrodes positioned in the third region, the method comprising:

forming a bank portion on a substrate, the bank portion provided with apertures at positions corresponding to the plurality of pixel electrodes positioned in the first, second, and third regions, each aperture comprising a lower portion and an upper portion, the upper portion formed to be larger than the lower portion;

forming, in the apertures positioned in the second region, the first light-emitting layer;

forming, in an aperture positioned in the first region, the second light-emitting layer on the first pixel electrode;

forming, in another aperture positioned in the first region, the third light-emitting layer on the second pixel electrode;

forming, in another aperture positioned in the first region, the fourth light-emitting layer on the third pixel electrode; and forming an opposite electrode on the first, second, and third regions after forming the first, second and third light-emitting layers, wherein forming the opposite electrode includes:

forming a first metal layer being a lithium fluoride layer only on the first and third regions;

forming a second metal layer on the first, second, and third regions after forming the first metal layer; and forming a third metal layer on the first, second, and third regions after forming the second metal layer.

2. The method of manufacturing a display device as set forth in claim 1, further comprising:

forming a hole injection/transporting layer in the apertures positioned in the first, second, and third regions before forming the first, second, third, and fourth light-emitting layers.

* * * * *